(12) United States Patent
Siemieniec et al.

(10) Patent No.: US 11,195,921 B2
(45) Date of Patent: Dec. 7, 2021

(54) SEMICONDUCTOR DEVICE WITH SILICON CARBIDE BODY

(71) Applicant: Infineon Technologies AG, Neubiberg (DE)

(72) Inventors: Ralf Siemieniec, Villach (AT); Thomas Aichinger, Faak am See (AT); Romain Esteve, Prisdorf (DE); Ravi Keshav Joshi, Klagenfurt (AT); Shiqin Niu, Freising (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/412,131

(22) Filed: May 14, 2019

(65) Prior Publication Data
US 2019/0355819 A1 Nov. 21, 2019

(30) Foreign Application Priority Data

May 15, 2018 (DE) .......................... 102018111653.5
Apr. 9, 2019 (DE) .......................... 102019109368.6

(51) Int. Cl.
*H01L 29/76* (2006.01)
*H01L 29/16* (2006.01)
*H01L 29/66* (2006.01)
*H01L 29/423* (2006.01)
*H01L 29/78* (2006.01)

(52) U.S. Cl.
CPC ...... *H01L 29/1608* (2013.01); *H01L 29/4236* (2013.01); *H01L 29/66068* (2013.01); *H01L 29/66348* (2013.01); *H01L 29/66666* (2013.01); *H01L 29/7802* (2013.01); *H01L 29/7813* (2013.01); *H01L 29/7827* (2013.01); *H01L 29/7828* (2013.01)

(58) Field of Classification Search
CPC ........... H01L 29/1608; H01L 29/66348; H01L 29/7813; H01L 29/66068; H01L 29/66666; H01L 29/4236; H01L 29/7828; H01L 29/7396; H01L 29/401; H01L 21/049; H01L 29/42376; H01L 29/41766; H01L 29/1095; H01L 29/0623; H01L 29/7397; H01L 29/7811; H01L 29/0696; H01L 29/045; H01L 29/4925; H01L 29/7802; H01L 29/7827
See application file for complete search history.

(56) References Cited

U.S. PATENT DOCUMENTS 5,976,936 A 11/1999 Miyajima et al.
7,365,382 B2 * 4/2008 Willer .................. H01L 27/115
257/295
7,459,749 B2 12/2008 Yoshimochi
(Continued)

FOREIGN PATENT DOCUMENTS

DE 102013207740 A1 3/2014

*Primary Examiner* — Shouxiang Hu
(74) *Attorney, Agent, or Firm* — Murphy, Bilak & Homiller, PLLC

(57) ABSTRACT

A semiconductor device includes a gate electrode and a gate dielectric. The gate electrode extends from a first surface of a silicon carbide body into the silicon carbide body. The gate dielectric is between the gate electrode and the silicon carbide body. The gate electrode includes a metal structure and a semiconductor layer between the metal structure and the gate dielectric.

16 Claims, 17 Drawing Sheets

(56) References Cited

U.S. PATENT DOCUMENTS

| | | | |
|---|---|---|---|
| 7,612,407 B2* | 11/2009 | Hshieh | H01L 29/407 |
| | | | 257/330 |
| 7,663,181 B2* | 2/2010 | Ohyanagi | H01L 29/7722 |
| | | | 257/328 |
| 8,115,251 B2* | 2/2012 | Anderson | H01L 29/4236 |
| | | | 257/330 |
| 9,548,372 B2 | 1/2017 | Cheng et al. | |
| 9,704,988 B2 | 7/2017 | Oh | |
| 2002/0024091 A1 | 2/2002 | Mo | |
| 2008/0179668 A1* | 7/2008 | Tai | H01L 29/66727 |
| | | | 257/331 |
| 2011/0014763 A1 | 1/2011 | Sreekantham et al. | |
| 2012/0122309 A1 | 5/2012 | Park et al. | |
| 2014/0353667 A1 | 12/2014 | Konrath et al. | |

\* cited by examiner

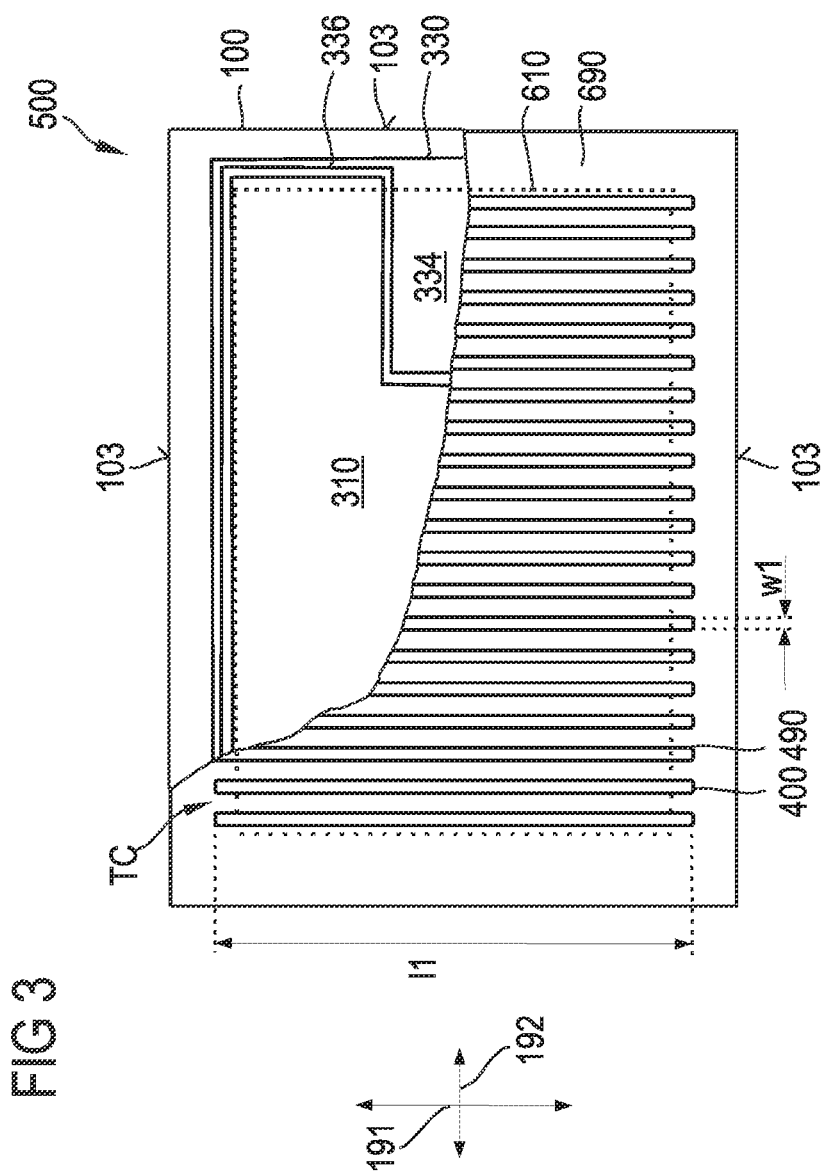

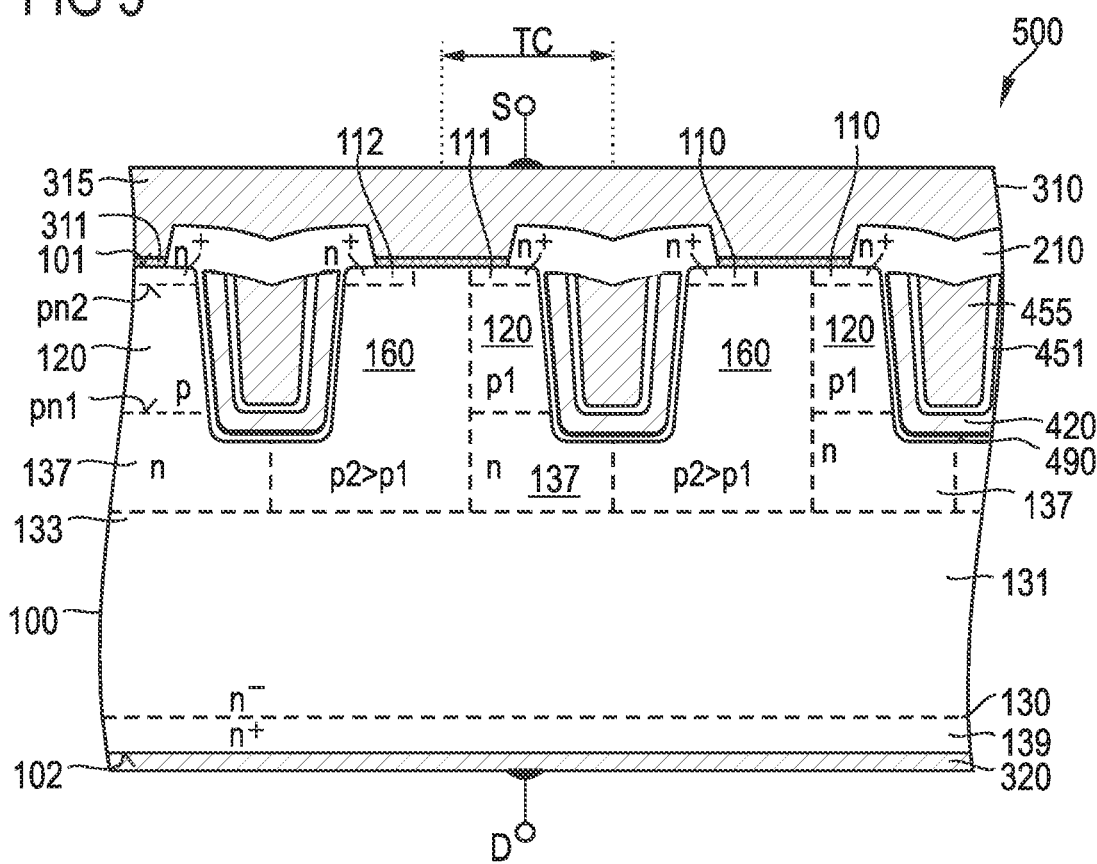

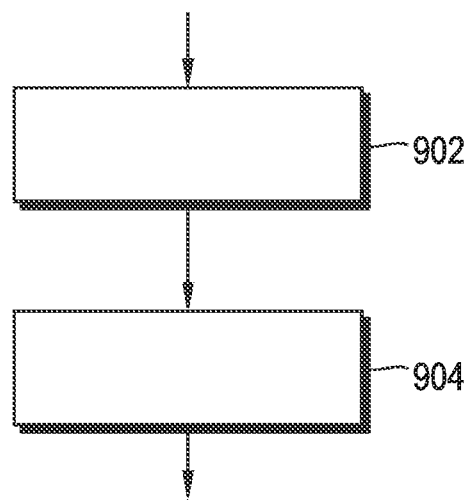

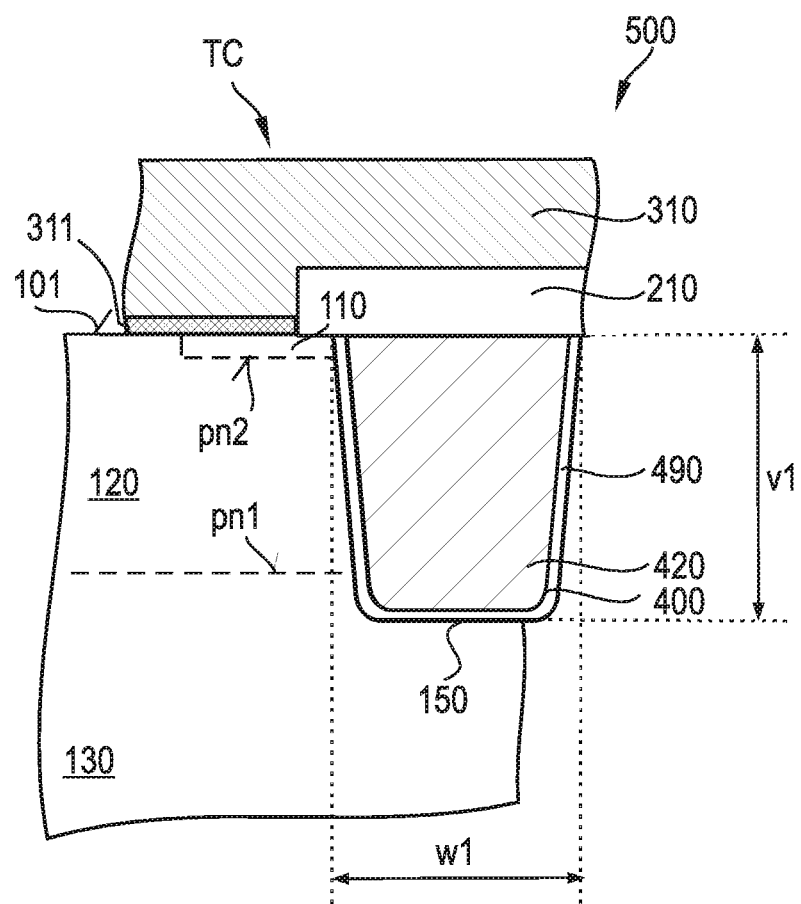

SEMICONDUCTOR DEVICE WITH SILICON CARBIDE BODY

TECHNICAL FIELD

The present disclosure relates to silicon carbide semiconductor devices with high voltage blocking capability.

BACKGROUND

Power semiconductor devices are typically used for transforming electric energy, for example in DC/AC converters, AC/AC converters or AC/DC converters, and for driving heavy inductive loads. In vertical power semiconductor devices a load current flows between a first load electrode at a front side and a second load electrode on the backside of a semiconductor die. The high dielectric breakdown field strength of silicon carbide compared to silicon results in silicon carbide semiconductor switches being significantly thinner than equivalent silicon devices for the same nominal blocking voltage. Accordingly, the on-state resistance of a silicon carbide semiconductor device can be significantly lower than the on-state resistance of a silicon device with the same voltage blocking capability.

There is a need for further improving the on-state resistance of silicon carbide devices of a given size.

SUMMARY

An embodiment of the present disclosure relates to a semiconductor device that includes a gate electrode and a gate dielectric. The gate electrode extends from a first surface of a silicon carbide body into the silicon carbide body. The gate dielectric is positioned between the gate electrode and the silicon carbide body. The gate electrode includes a metal structure and a semiconductor layer between the metal structure and the gate dielectric.

Another embodiment of the present disclosure relates to a method of manufacturing a semiconductor device. The method includes providing a silicon carbide substrate, wherein a gate trench extends from a main surface of the silicon carbide substrate into the silicon carbide substrate. A gate dielectric is formed on at least one sidewall of the gate trench. A gate electrode is formed in the gate trench. The gate electrode includes a metal structure and a semiconductor layer between the metal structure and the gate dielectric.

BRIEF DESCRIPTION OF THE DRAWINGS

The accompanying drawings are included to provide a further understanding the embodiments and are incorporated in and constitute a part of this specification. The drawings illustrate the embodiments of the semiconductor device and the method of manufacturing a semiconductor device and together with the description serve to explain principles of the embodiments. Further embodiments are described in the following detailed description and the claims.

FIG. 3 shows a schematic plan view of a semiconductor device with a gate structure at a front side according to a further embodiment.

FIG. 5 shows a schematic cross-sectional view of a semiconductor device with a contact layer according to a further embodiment related to transistor cells with one-sided channel.

FIG. 8 is a simplified flowchart for illustrating a method of manufacturing a semiconductor device.

FIG. 14 shows a schematic vertical cross-sectional view of a portion of a semiconductor device with a gate electrode with low phosphorus content according to a further embodiment.

DETAILED DESCRIPTION

Figure 1:
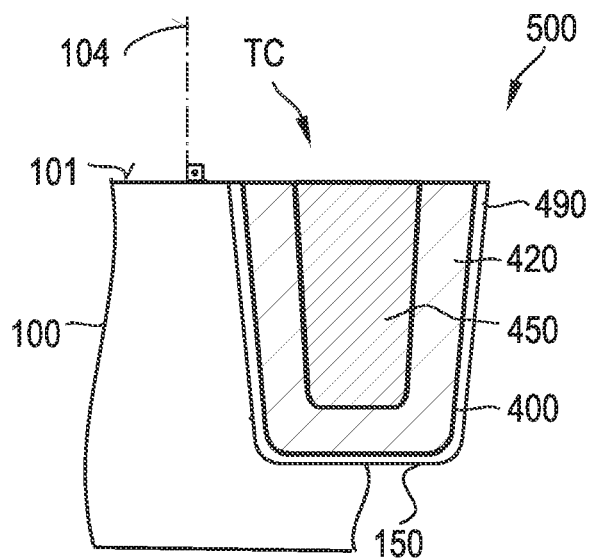
FIG. 1 shows a schematic vertical cross-sectional view of a portion of a semiconductor device according to an embodiment.

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy. Main constituents of a layer or structure from a mixture of substances are those elements that shall have a defined ratio in the mixture. For example, the main constituents of a layer obtained by co-sputtering are the elements contained in the targets used for the co-sputtering. In addition to the main constituents, layers and structures may include unintentional impurities due to process imperfections as well as intentional additives such as dopants.

The terms metal and metallic as used in the context of this application do not include semi-metals. In particular, the terms metal and metallic do not include the elements boron, silicon, germanium, arsenic, antimony and/or tellurium. For example, the term metal includes transition metals and post-transition metals. Post-transition metals may include the chemical elements with the atomic numbers 13, 30 to 31, 48 to 50, and 80 to 84. Transition metals may include at least the chemical elements with the atomic numbers 21 to 29, 39 to 47, and 72 to 79. A metal structure includes at least a metallic portion and may include, in addition to the metallic portion, a further portion or further portions from non-metallic material or from semi-metallic material.

A conformal layer has a thickness that is substantially the same along an interface to a base on which the conformal layer is formed. A conformal layer may exhibit marginal thickness variations along edges, steps or other elements of the base but is nevertheless considered a conformal layer if the magnitude of the thickness variations is low compared to a mean thickness of the conformal layer. A conformal layer may be formed by thin-film deposition methods such as CVD (chemical vapor deposition), plating, or ALD (atomic layer deposition).

An embodiment relates to a semiconductor device with a gate electrode that may extend from a first surface of a silicon carbide body into the silicon carbide body. A gate dielectric may be positioned between the gate electrode and the silicon carbide body. The gate electrode may include a metal structure and a semiconductor layer, wherein the semiconductor layer is between the metal structure and the gate dielectric.

The first surface of the silicon carbide body may be a main surface of the silicon carbide body, along which the silicon carbide body extends. The first surface may be spanned by lateral directions. Perpendicular to the first surface, in a vertical direction, the silicon carbide body has a thickness which is small compared to the extension of the silicon carbide body in the lateral directions.

The metal structure may reduce the line resistance of the gate electrode. The metal structure may also improve uniformity of the switching behavior of the semiconductor device along stripe-shaped gate electrodes and distributes the on-state current more uniformly across a lateral extension of the semiconductor device.

The semiconductor layer may separate the metal structure from the gate dielectric such that a threshold voltage of the semiconductor device can be decoupled from the work function of the metal structure. The presence of the semiconductor layer may prevent a reduction of a dopant concentration in the body region, which in turn typically has to be compensated by a longer channel length to avoid drain induced barrier lowering (DIBL). It is further possible for the semiconductor layer to facilitate the use of a metal gate without inherently increasing the channel resistance as a consequence of a longer channel.

The semiconductor layer may further cover and protect the gate dielectric during forming of the metal structure. Said forming may include the application of aggressive, e.g. chlorine-based, precursors that may lead to defects in the gate dielectric.

According to an embodiment, the semiconductor layer may include at least one of doped polycrystalline silicon, e.g., n-doped polycrystalline silicon, and intrinsic polycrystalline silicon. The effective work function of the gate electrode and the doping in the body region contribute in defining the threshold voltage of the semiconductor device. Providing the semiconductor layer at least partly from heavily doped polycrystalline silicon may facilitate a comparatively high dopant concentration in the body region, wherein the high dopant concentration may result in comparatively low channel resistance. A doping concentration within the semiconductor layer, e.g. in the case of polycrystalline silicon, may be at least $10^{18}$ cm$^{-3}$ and at most $2\times10^{21}$ cm$^{-3}$.

The semiconductor layer may include phosphorus atoms as unwanted impurities or as intended impurities, wherein a concentration of the phosphorus atoms in the semiconductor layer is at most $10^{19}$ cm$^{-3}$ or at most $5\times10^{18}$ cm$^{-3}$ or at most $10^{18}$ cm$^{-3}$. Such a low phosphorus content may be sufficient to allow for good conductivity of the semiconductor layer in the gate electrode.

For example, the semiconductor layer may be a comparatively heavily doped n-type polycrystalline silicon layer with a mean dopant concentration of at least $10^{20}$ cm$^{-3}$, wherein the semiconductor layer contains arsenic atoms, sulfur atoms and/or selenium atoms. For example, the semiconductor layer contains no phosphorus atoms or only a small portion of phosphorus atoms at a phosphor concentration of at most $10^{19}$ cm$^{-3}$ or at most $5 \times 10^{18}$ cm$^{-3}$ or at most $10^{18}$ cm$^{-3}$.

According to another example, the semiconductor layer may be a comparatively weakly doped n-type polycrystalline silicon layer, wherein a total donor concentration in the semiconductor layer is at most $5 \times 10^{19}$ cm$^{-3}$ or at most $10^{19}$ cm$^{-3}$ or at most $5 \times 10^{18}$ cm$^{-3}$. For example, a phosphor concentration in a weakly doped n-type polycrystalline silicon layer may be at most $5 \times 10^{18}$ cm$^{-3}$ or at most $10^{18}$ cm$^{-3}$.

According to an alternative embodiment, the semiconductor layer may be intrinsic or approximately intrinsic with a net dopant concentration lower than the intrinsic carrier concentration.

According to an embodiment, the semiconductor layer may be or may include a p-type crystalline silicon layer. In particular, the semiconductor layer may be or may include a comparatively heavily doped p-type polycrystalline silicon layer with a mean dopant concentration of at least $10^{20}$ cm$^{-3}$. In this case, it may be possible that the semiconductor layer exclusively contains acceptor atoms, e.g. boron atoms. Alternatively, the semiconductor layer may further contain donator atoms, e.g., phosphorus atoms. In the case of phosphorus atoms, a concentration of phosphorus atoms may then be at most $5 \times 10^{18}$ cm$^{-3}$ or at most $10^{18}$ cm$^{-3}$. Agate electrode with p-doped semiconductor layer may be provided in semiconductor devices with n-channel transistor cells, in particular in semiconductor devices with n-doped source region and p-doped body region.

The metal structure may include a first layer which may be in direct contact with a semiconductor layer and which includes at least a first transition metal.

The first transition metal may be molybdenum, titanium or tantalum. In addition to the first transition metal, the first layer may include nitrogen. A first layer from, e.g. Ti, TiN, Mo, MoN, TaN may form bonds with the semiconductor layer and may provide sufficient adhesion of the metal structure on the semiconductor layer.

The metal structure may further include a fill structure formed on the first layer, wherein the first layer may separate the fill structure from the semiconductor layer. The fill structure may include a second transition metal. The second transition metal may differ from the first layer in at least one main constituent. For example, the second transition metal may be tungsten.

According to an embodiment, the semiconductor device may include a contact layer in contact with the silicon carbide body. The contact layer may be formed directly on the first surface. The material of the contact layer and the material of the first layer may be selected in accordance with an appropriate process that ensures integrity of the gate dielectric, the first layer, the contact layer and of an interlayer dielectric that separates the gate electrode from a load electrode.

According to an embodiment, the contact layer may include titanium, titanium nitride, tantalum and/or tantalum nitride and the first layer of the metal structure includes titanium, titanium nitride, tantalum and/or tantalum nitride. The contact layer and the first layer may be formed from the same material(s) or from different material(s). Both the contact layer and the first layer may be formed at a stage at which both contact regions of the silicon carbide body and the semiconductor layer are exposed. For example, the first layer and the contact layer may be formed contemporaneously without that the formation of the first layer invokes any restrictions for the formation of the contact layer and without that formation of the contact layer invokes any restrictions for the formation of the first layer.

According to another embodiment, the contact layer may include nickel aluminum (NiAl) and the first layer may include molybdenum and/or molybdenum nitride. The first layer may be formed and covered with an interlayer dielectric prior to the formation of the contact layer. Since the formation temperature of molybdenum silicide (MoSi) is higher than that typically applied for the formation of NiAl, the formation of a NiAl contact layer does not damage the previously interlayer dielectric, because the interlayer dielectric does not cover a metal that induces mechanical strain into the interlayer dielectric by silicidation.

According to an embodiment, a second layer may be formed between the first layer and the fill structure, wherein the second layer includes a third transition metal and wherein the second layer differs from the first layer in at least one main constituent.

According to embodiments, the silicon carbide body includes a drift structure, a source region and a body region. The drift structure includes at least a drift region. The drift region forms a voltage sustaining layer, wherein the vertical extension and the dopant concentration in the drift region are selected such that the semiconductor device reaches its nominal blocking voltage capability. The source region is positioned between the body region and the first surface. The body region forms a first pn junction with the drift structure and a second pn junction with the source region. The body region is in contact with the gate dielectric.

According to at least one embodiment, the semiconductor device includes a gate structure on the first surface of the silicon carbide body. The gate structure and the gate electrode may be electrically connected via at most two contact areas. The contact areas are spaced apart from each other along a first direction. The first direction may run parallel to the first surface. For example, the gate structure may form at most two contact areas with a stripe-shaped gate electrode. In this case, the contact areas of the stripe-shaped gate electrode are spaced from each other along the first direction, which may run perpendicular to a main extension direction of the stripe-shaped gate electrode. The gate structure may include a metal.

With the low-resistive metal gate electrode the semiconductor device may not require any additional contacts to the gate electrode between two opposite ends of a stripe-shaped gate electrode. Gate fingers that are typically formed above the first surface and that contact the stripe-shaped gate structures in a distance to both longitudinal ends of the gate structures may be omitted. With the omission of gate fingers, the active area of the semiconductor device and the area efficiency of the semiconductor device are increased.

In at least one embodiment, the semiconductor device comprises a first load electrode on and/or at the first surface of the silicon carbide body. The gate structure may be formed between the first load electrode and a lateral surface of the silicon carbide body. The lateral surface of the silicon carbide body may run along the vertical direction of the silicon carbide body.

According to at least one embodiment, the gate structure may include a gate pad and at least one gate conducting line connected (e.g. electrically connected) with the gate pad. The gate conducting line may form a closed frame or an incomplete frame around a transistor cell field. The gate conducting lines are in contact with each single one of a plurality of stripe-shaped gate electrodes. Each of the gate electrodes may have a longitudinal extension along a first direction. The gate electrodes are spaced from each other orthogonally to the first direction.

In at least one embodiment, the semiconductor device comprises a plurality of gate electrodes in the silicon carbide body. Each of the gate electrodes may have a longitudinal extension along the first direction. Further, the gate electrodes are spaced apart from each other orthogonally to the first direction. For example, the gate electrodes may be equally distributed along a second direction that runs perpendicular to the first direction.

Embodiments of the present disclosure further refer to a method of manufacturing a semiconductor device. At least some embodiments of the semiconductor device described herein may be manufactured with the method described herein. That is to say, features disclosed with respect to the semiconductor device are also disclosed for the method and vice versa.

In at least one embodiment of the method, a silicon carbide substrate is provided. A trench extends from a main surface of the silicon carbide substrate into the silicon carbide substrate. A gate dielectric is formed on at least one sidewall of the trench. A gate electrode in the trench includes a metal structure and a semiconductor layer between the metal structure and the gate dielectric.

According to at least one embodiment, formation of the gate electrode includes depositing a first metal layer on the semiconductor layer and on the main surface. From sections of the first metal layer a contact layer on the main surface and a first layer of the metal structure are formed. The first metal layer and the contact layer may be formed contemporaneously such that the formation of the first metal layer does not adversely affect a previously formed contact layer and formation of the contact layer cannot adversely affect a previously formed first metal layer. For example, the first metal layer and the contact layer may be formed from at least one of Ti, TiN, Ta, TaN.

According to at least one embodiment, the contact layer may be formed on a main surface and then (i.e., subsequently) a first layer of the metal structure is formed on the semiconductor layer. The contact layer can include a metal silicide and/or nickel aluminum. Since the contact layer is formed prior to the first layer, formation of the contact layer does not adversely affect a previously formed first layer. For example, the contact layer may include nickel and aluminum and the first layer may include at least one of Ti, TiN, Ta or TaN as main constituent(s).

According to at least one embodiment, a first layer of the metal structure is formed on the semiconductor layer and then (i.e., subsequently) a contact layer is formed on the main surface. The first layer may include a transition metal or a transition metal nitride with a silicidation temperature above the process temperature for a nickel aluminum contact layer. For example, the first layer may include molybdenum or molybdenum nitride and the contact layer may include nickel and aluminum. Forming the contact layer from molybdenum or molybdenum nitride facilitates a later formation of nickel aluminum as ohmic contact to doped regions in the silicon carbide body.

The semiconductor device 500 shown in FIG. 1 may be an IGBT (insulated gate bipolar transistor), an MCD (MOS controlled diode), or an IGFET (insulated gate field effect transistor), for example, an MOSFET (metal oxide semiconductor FET).

The semiconductor device 500 includes a silicon carbide body 100 which is based on a silicon carbide crystal including the main constituents silicon and carbon. The silicon carbide crystal may include unwanted impurities like hydrogen and oxygen and/or intended impurities, e.g., dopant atoms. The polytype of the silicon carbide crystal may be 2H, 6H, 15R or 4H, by way of example.

A first surface 101 at a front side of the silicon carbide body 100 may be planar or ripped. A surface normal 104 orthogonal to a planar first surface 101 or orthogonal to a mean plane of a ripped first surface 101 defines a vertical direction. Directions orthogonal to the surface normal 104 are horizontal and lateral directions.

The semiconductor device 500 may include a transistor cell TC with a trench gate structure 150 that extends from the first surface 101 into the silicon carbide body 100. The trench gate structure 150 includes a gate dielectric 490 and a conductive gate electrode 400.

The gate electrode 400 is electrically separated from the silicon carbide body 100. For example, the gate dielectric 490 may completely separate the gate electrode 400 from the silicon carbide body 100. According to other embodiments, one or more further dielectric structures with a material configuration different from the gate dielectric 490 and/or thicker than the gate dielectric 490 may be formed between the gate electrode 400 and the silicon carbide body 100.

The gate electrode 400 includes a metal structure 450 and a semiconductor layer 420, wherein the semiconductor layer 420 is positioned between the metal structure 450 and the gate dielectric 490. The semiconductor layer 420 may separate the metal structure 450 from the gate dielectric 490.

The semiconductor layer 420 may be or may include heavily doped polycrystalline silicon. For example, the semiconductor layer 420 includes n-doped or p-doped polycrystalline silicon. A dopant concentration in the semiconductor layer 420 may be at least $10^{19}$ cm$^{-3}$. The metal structure 450 may be a homogeneous structure or may include one or more sublayers of different materials.

Figure 2:
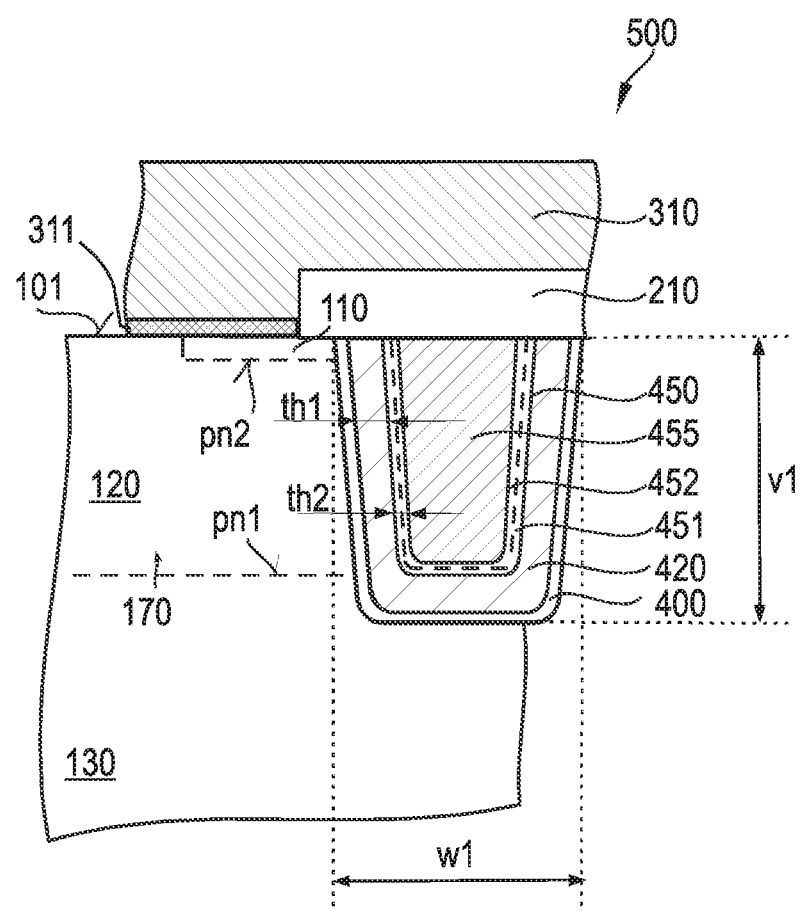
FIG. 2 shows a schematic vertical cross-sectional view of a portion of a semiconductor device with a contact layer according to a further embodiment.

FIG. 2 shows a semiconductor device 500 with a transistor cell TC including a source region 110, a body region 120 and a trench gate structure 150. The trench gate structure 150 includes a gate electrode 400 extending from a first surface 101 into the silicon carbide body 100. The source and body regions 110, 120 are formed in a semiconductor mesa 170 formed from a portion of the silicon carbide body 100. A first load electrode 310 is electrically connected to the source region 110 and to the body region 120. An interlayer dielectric 210 electrically separates the first load electrode 310 and the gate electrode 400.

The source region 110 and the body region 120 directly adjoin a first sidewall of the trench gate structure 150. The source region 110 is between the body region 120 and the first surface 101. The body region 120 separates the source region 110 from a drift structure 130. The drift structure 130 is formed between the body region 120 and a second surface of the silicon carbide body 100, wherein the second surface is opposite to the first surface 101. The body region 120 and the drift structure 130 form a first pn junction pn1. The body region 120 and the source region 110 form a second pn junction pn2.

A vertical extension of the trench gate structure 150 may be in a range from 0.3 µm to 5 µm, e.g., in a range from 0.5 µm to 2 µm. Sidewalls of the trench gate structures 150 may be vertical or may tapper with increasing distance to the first surface 101. A width w1 of the trench gate structure 150 in the plane of the first surface 101 may be in a range from 500 nm to 5 µm, e.g., in a range from 1 µm to 3 µm.

The trench gate structure 150 includes a gate dielectric 490 that separates the gate electrode 400 at least from the body region 120. The gate dielectric 490 may include or consist of a semiconductor dielectric, for example, thermally grown or deposited semiconductor oxide, e.g., silicon oxide, a semiconductor nitride, e.g., deposited or thermally grown silicon nitride, and/or a semiconductor oxynitride, e.g., silicon oxynitride. Thickness and material configuration of the gate dielectric 490 may be selected to achieve a suitable threshold voltage for the transistor cell TC. According to an embodiment concerning n-channel transistor cells of the enhancement type, thickness and material configuration of the gate dielectric 490 may be selected to achieve a suitable threshold voltage in a range from 1.0 V to 8 V.

The gate electrode 400 may include a semiconductor layer 420 in contact with the gate dielectric 490. The semiconductor layer 420 may be a conformal layer and may have a thickness th1 in a range from 50 nm to 500 nm, for example from 100 nm to 300 nm.

The metal structure 450 may include a first layer 451 in contact with the semiconductor layer 420, a second layer 452 in contact with the first layer 451 and a fill structure 455. At least one of the first layer 451 and the second layer 452 may be a conformal layer. A total thickness of the first layer 451 and the second layer 452 may be in a range from 50 nm to 500 nm, for example in a range from 100 nm to 300 nm.

The first layer 451 may include a first transition metal, such as titanium, tantalum or molybdenum. For example, the first layer 451 may include a transition metal as the only main constituent. According to an embodiment the first layer 451 may include nitrogen as a second main constituent. The first load electrode 310 may include a contact layer 311 in direct contact with the source region 110 and the body region 120. The contact layer 311 may have the same material configuration as the first layer 451 or another material configuration. According to an embodiment the contact layer 311 may include nickel aluminum.

FIG. 3 is a plan view of a semiconductor device 500 including a central region 610 and an edge region 690 that surrounds the central region 610 in a horizontal plane and that separates the central region 610 from an outer lateral surface 103 connecting a first surface at the front side of the silicon carbide body 100 with an opposite second surface 102. The central region 610 includes functional transistor cells TC. The edge region 690 is devoid of functional transistor cells TC.

Gate electrodes 400 extend from the front side into the silicon carbide body 100. The gate electrodes 400 may have a horizontal longitudinal extension 11 along a horizontal first direction 191 and a width w1 along a horizontal second direction 192, wherein the length 11 may be at least 10 times the width w1. The gate electrodes 400 may extend at least from one side of the central region 610 to the opposite side and may extend into the edge region 690. A plurality of stripe-shaped gate electrodes 400 may be arranged along the second direction 192.

At the front side of the silicon carbide body 100 a gate structure 330 is in contact with the gate electrodes 400. The gate structure 330 may be electrically connected to each gate electrode 400 along one single contact area or along two contact areas, wherein the two contact areas are spaced from each other along the first direction 191.

In the embodiment of FIG. 3 the gate structure 330 includes two gate conducting lines 336 that may be formed completely or at least partly in the edge region 690. The central region 610 may be devoid of gate structures 330 such that the complete central region 610 can be used for the formation of active transistor cells. A gate conducting line 336 may form a closed frame or an incomplete frame around the central region 610.

The gate structure 330 may further include a gate pad 334. The gate conducting line 336 may be a comparatively thin metal line. The gate pad 334 may include a comparatively thick metallization. The gate pad 334 may be directly connected with the gate conducting line 336 or through a resistor, e.g. a polysilicon structure with an electric resistance of some few ohms.

A first load electrode 310 may include a comparatively thick metallization. The metallization for the gate pad 334 and the first load electrode 310 may be based on the same materials (e.g., may comprise the same materials or consist of the same materials) and may have the same thickness. The first load electrode 310 may vertically overlap with the gate conducting line 336, wherein an interlayer dielectric may electrically separate the first load electrode 310 and the gate conducting line 336. The first load electrode 310 and the gate pad 334 may form landing pads for bond wires or metal clips connecting the first load electrode 310 and the gate pad 334 with terminals of the semiconductor device 500.

Figure 4A:
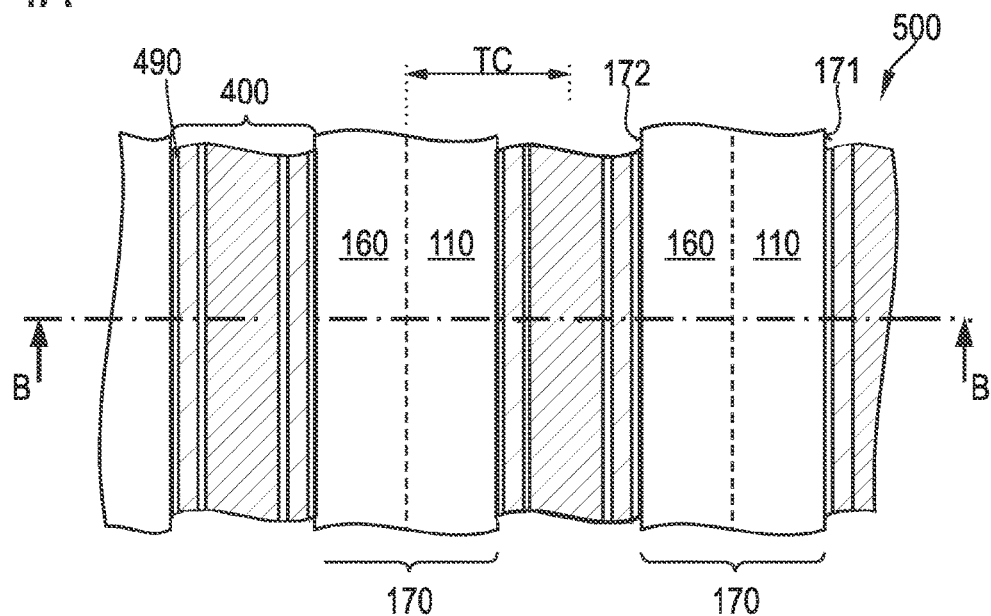
FIGS. 4A to 4B show schematic horizontal and vertical cross-sectional views of a semiconductor device including transistor cells with one-sided channel.
Figure 4B:
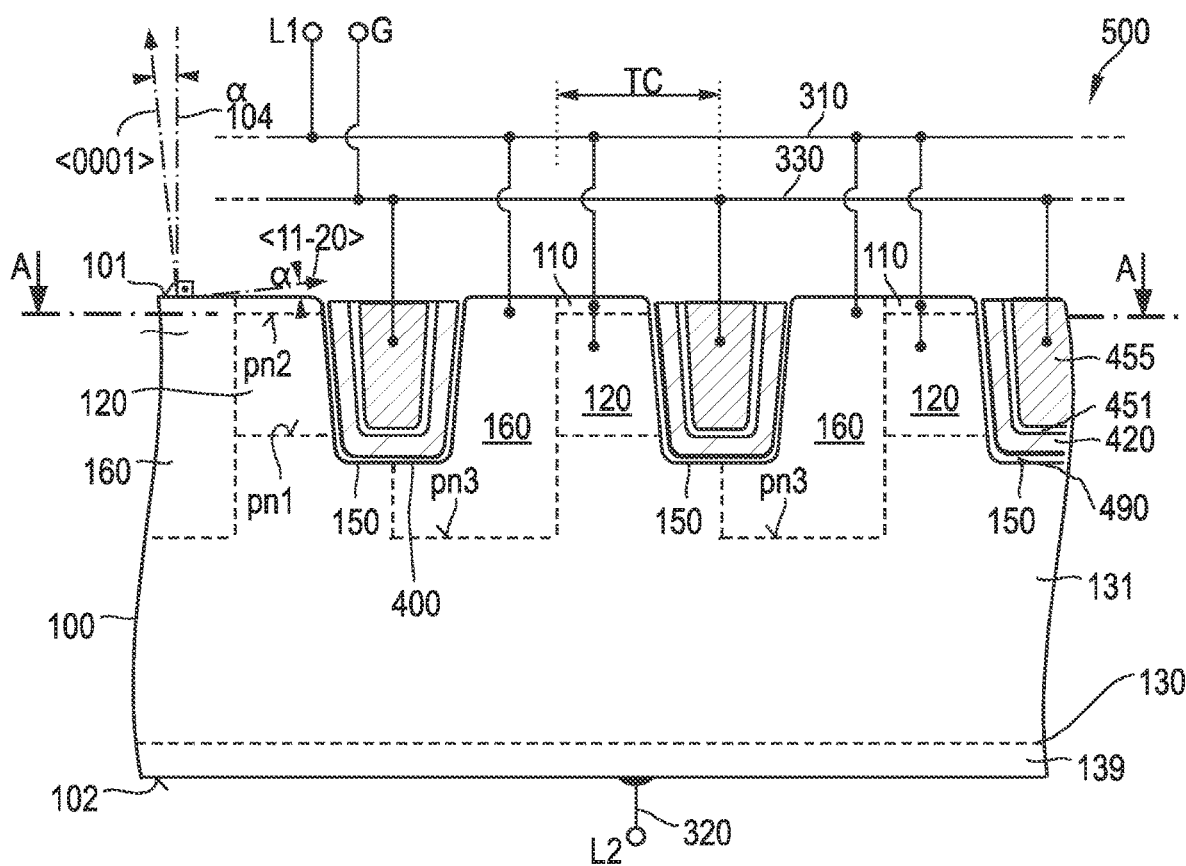

FIGS. 4A and 4B refer to a semiconductor device 500 with a silicon carbide body 100 from 4H—SiC. The <0001> crystal axis is tilted by an off-axis angle α to the surface normal 104. The <11-20> crystal axis is tilted by the off-axis angle α with respect to the horizontal plane. The <1-100> crystal axis is orthogonal to the cross-sectional plane. The off-axis angle α may be in a range from 2° to 8°. For example, the off-axis angle α may be 4°.

According to an embodiment, the first surface 101 may be serrated and includes first and second surface sections. The first surface sections may be shifted to each other and may be tilted to a horizontal plane by the off-axis angle α. The second surface sections are tilted to the first surface sections and connect the first surface sections such that a cross-sectional line of the serrated first surface 101 approximates a saw-tooth line.

On the backside of the silicon carbide body 100 an opposite second surface 102 may extend parallel to the first surface 101. A surface normal 104 to the first surface 101 defines a vertical direction and directions parallel to the first surface 101 are horizontal directions.

The transistor cells TC are formed at the front side along the first surface 101. A drift structure 130 separates the transistor cells TC from a second surface 102 at the backside. The drift structure 130 may include a heavily doped contact structure 139 directly adjoining the second surface 102 and a lightly doped drift zone 131 between the transistor cells TC and the heavily doped contact structure 139.

The heavily doped contact structure 139 may be or may include a substrate portion obtained from a crystalline ingot and forms an ohmic contact with a second load electrode 320 that directly adjoins the second surface 102. A mean dopant concentration in the contact structure 139 is sufficiently high to ensure an ohmic contact with the second load electrode 320. In case the semiconductor device 500 is or includes an MCD or an IGFET, the contact structure 139 has the same conductivity type as the drift zone 131. In case the semiconductor device 500 is an IGBT, the contact structure 139 has the complementary conductivity type of the drift zone 131 or includes zones of both conductivity types.

The drift zone 131 may be formed in a layer grown by epitaxy on the contact structure 139. A mean net dopant concentration in the drift zone 131 may be in the range from $1E15$ $cm^{-3}$ to $5E16$ $cm^{-3}$. A vertical extension of the drift zone 131 is related to a nominal blocking capability of the semiconductor device 500. The vertical extension of the drift zone 131 may be in the range of about 1 μm to several 10 μm. The drift structure 130 may include further doped regions, for example field stop zones, barrier zones and/or current spread zones of the conductivity type of the drift zone 131 or counter-doped regions.

The drift zone 131 may directly adjoin the contact structure 139 or a buffer layer forming a unipolar homojunction with the drift zone 131 may be sandwiched between the drift zone 131 and the contact structure 139, wherein a vertical extension of the buffer layer may be approximately in a range from 1 µm to 10 µm and a mean dopant concentration in the buffer layer may be in a range from $3E17$ $cm^{-3}$ to $1E18$ $cm^{-3}$, by way of example. The buffer layer may relax mechanical stress in the silicon carbide body 100 and/or may contribute to shaping the electric field in the drift structure 130.

The transistor cells TC are formed along trench gate structures 150 that extend from the first surface 101 into the silicon carbide body 100. The silicon carbide body 100 includes semiconductor mesas 170 between neighboring trench gate structures 150.

A longitudinal extension of the trench gate structures 150 along a horizontal first direction 191 is greater than a width along a horizontal second direction 192 orthogonal to the first direction. The trench gate structures 150 may be long stripes extending from one side of a transistor cell region to an opposite side, wherein the length of the trench gate structures 150 may be up to several millimeters. According to other embodiments, a plurality of separated trench gate structures 150 may be formed along a line extending from one side of the transistor cell region to the opposite side, or the trench gate structures 150 may form a grid with the semiconductor mesas 170 formed in the meshes of the grid.

At the bottom, the trench gate structures 150 may be rounded, wherein a radius of the curvature may be at least twice the thickness of a gate dielectric 490 described in the following.

The trench gate structures 150 may be equally spaced, may have equal width, and/or may form a regular pattern. A center-to-center distance (also called pitch) of the trench gate structures 150 may be in a range from 1 µm to 10 µm, e.g., from 2 µm to 5 µm. A vertical extension of the trench gate structures 150 may be in a range from 0.3 µm to 5 µm, e.g., in a range from 0.5 µm to 2 µm.

The trench gate structures 150 may taper with increasing distance to the first surface 101. For example, a taper angle of the trench gate structures 150 with respect to the vertical direction may be equal to the off-axis angle α or may deviate from the off-axis angle α by not more than ±1 degree such that at least a first mesa sidewall 171 of two opposite longitudinal mesa sidewalls 171, 172 is formed by a main crystal plane with high charge carrier mobility, e.g., a {11-20} crystal plane. A second mesa sidewall 172 opposite to the first mesa sidewall 171 may be tilted to a main crystal plane by twice the off-axis angle α, e.g., by 4 degree or more, for example, by about 8 degrees. The first and second mesa sidewalls 171, 172 are on opposite longitudinal sides of the intermediate semiconductor mesa 170 and directly adjoin two different, neighboring trench gate structures 150.

The trench gate structure 150 includes a conductive gate electrode 400 and a gate dielectric 490 as described herein. In the example shown in FIG. 4B, the gate electrode 400 comprises a metal structure 450 with a fill structure 455 and a first layer 451. The fill structure 455 may be freely accessible at the first surface 101, such that the fill structure 455 can be electrically connected. The gate electrode 400 further comprises a semiconductor layer 420 and a first layer 451, which first layer 451 separates, in particular completely separates, the semiconductor layer 420 from the fill structure 455. The metal structure 450 may comprise a second layer 452 (not shown in FIG. 4B), which may be positioned between the first layer 451 and the semiconductor layer 420. Furthermore, the gate dielectric 490 is positioned between the semiconductor layer 420 and the silicon carbide body 100.

The gate dielectric 490, the semiconductor layer 420, the first layer 451, and/or (if applicable) the second layer 452 may entirely cover the trench sidewalls and the trench bottom.

The semiconductor mesas 170 include source regions 110 that are positioned at the front side. The source regions 110 may directly adjoin the first surface 101 and may directly adjoin both longitudinal first and second mesa sidewalls 171, 172 of the respective semiconductor mesa 170.

The semiconductor mesas 170 further include body regions 120 that separate the source regions 110 from the drift structure 130. The body regions 120 form first pn junctions pn1 with the drift structure 130 and second pn junctions pn2 with the source regions 110. The body regions 120 directly adjoin the first mesa sidewall 171. A vertical extension of the body regions 120 corresponds to a channel length of the transistor cells TC and may be in a range from 0.2 µm to 1.5 µm. The source regions 110 and the body regions 120 are electrically connected to a first load electrode 310 at the front side.

The first load electrode 310 may form a first load terminal L1 or may be electrically connected or coupled to a first load terminal L1, which may be an anode terminal of an MCD, a source terminal of an IGFET or an emitter terminal of an IGBT. The second load electrode 320 may form a second load terminal L2 or may be electrically connected or coupled to a second load terminal L2, which may be a cathode terminal of an MCD, a drain terminal of an IGFET or a collector terminal of an IGBT.

Shielding regions 160 may separate the body regions 120 and the second mesa sidewalls 172. A dopant concentration in the shielding regions 160 along the second mesa sidewalls 172 may be higher, e.g., at least ten times higher than a dopant concentration in the body regions 120 along the first mesa sidewalls 171.

According to an embodiment, the transistor cells TC are n-channel FET cells with p-doped body regions 120, n-doped source regions 110 and n-doped drift zone 131. According to another embodiment, the transistor cells TC are p-channel FET cells with n-doped body regions 120, p-doped source regions 110 and p-doped drift zone 131.

The gate dielectric 490 capacitively couples portions of the body regions 120 to the gate electrode 400. When a potential at the gate electrode 400 exceeds or falls below a threshold voltage of the semiconductor device 500, the electric field effects that minority charge carriers in the body regions 120 form inversion channels along the gate dielectric 490, wherein the inversion channels connect the source regions 110 with the drift structure 130, thereby turning on the semiconductor device 500. In the on-state, a load current flows through the silicon carbide body 100 approximately along the first mesa sidewalls 171 between the first and second load electrodes 310, 320. At the same time the higher dopant concentration in the shielding regions 160 may suppress the formation of inversion channels along the second mesa sidewalls 172.

FIG. 5 shows source regions 110 including first source portions 111 formed along the first mesa sidewalls 171 and second source portions 112 formed along the second mesa sidewalls 172. The first and second source portions 111, 112 may be electrically connected through the first load electrode 310. Alternatively or in addition, the first and second source portions 111, 112 may be connected through third source portions extending in the silicon carbide body 100 along the first surface 101 from the first source portion 111 to the second source portion 112.

The drift structure 130 may include current spread regions 137 that directly adjoin the body regions 120 and that may extend between neighboring shielding regions 160.

The first load electrode 310 may include a contact layer 311 and a main metal structure 315. The contact layer 311 may include a transition metal or a transition metal nitride, for example Ti, TiN, Ta, TaN, Mo, MoN or a metal aluminum compound, for example NiAl with or without silicided portion.

Figure 6:
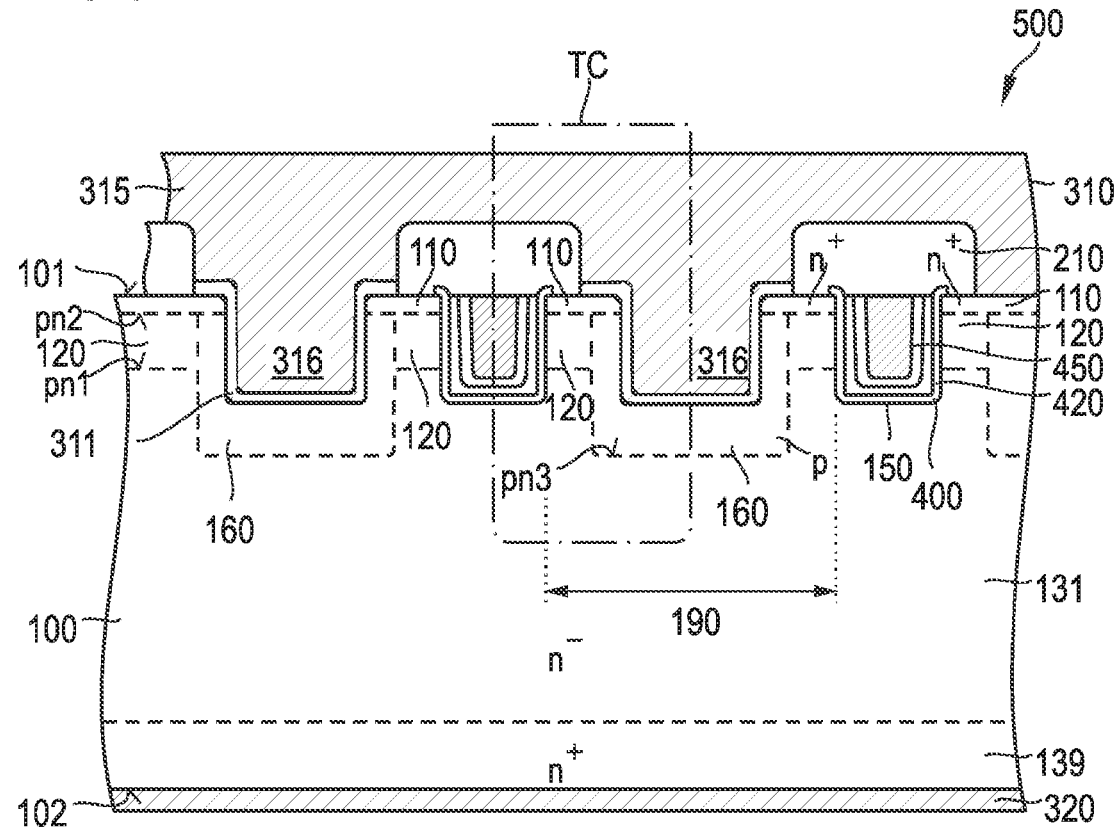
FIG. 6 shows a schematic cross-sectional view of a semiconductor device with a contact layer according to a further embodiment related to transistor cells with deep contact structures.

The semiconductor device 500 illustrated in FIG. 6 may be a SiC TMOSFET with transistor cells TC. Trench gate structures 150 of the transistor cells TC extend from a first surface 101 into a silicon carbide body 100. Sidewalls of the trench gate structures 150 may be vertical to the first surface 101. Semiconductor mesas between neighboring trench gate structures 150 include body regions 120 and source regions 110, wherein the source regions 110 may be formed along the first surface 101. The body regions 120 form first pn junctions pn1 with the drift structure 130 and second pn junctions pn2 with the source regions 110. Sidewalls of the semiconductor mesas 170 may be main crystal planes of the silicon carbide crystal.

A first load electrode 310 may include trench contacts 316 that may extend between neighboring trench gate structures 150 from the first load electrode 310 through openings of an interlayer dielectric 210 into the semiconductor mesas. The first load electrode 310 is electrically connected to the source regions 110 and to the body regions 120.

The transistor cells TC may include shielding regions 160 having the conductivity type of the body regions 120. The shielding regions 160 may have a higher dopant concentration than the body regions 120 and may be laterally spaced from the trench gate structures 150. Two adjoining shielding regions 160 may shield the trench gate structure 150 formed between the two shielding regions 160 against a potential applied at a rear side electrode (which may correspond to the second load electrode 320). A vertical extension of the shielding regions 160 may be greater than a vertical extension of the trench gate structures 150. For example, a local dopant concentration maximum in the shielding regions 160 may have a greater distance to the first surface 101 than a bottom of the trench gate structures 150.

The trench gate structures 150 may include a gate electrode 400 as described above with reference to FIGS. 1 to 5. The first load electrode 310 may include a contact layer 311 as described with reference to FIGS. 2 to 5.

Figure 7:
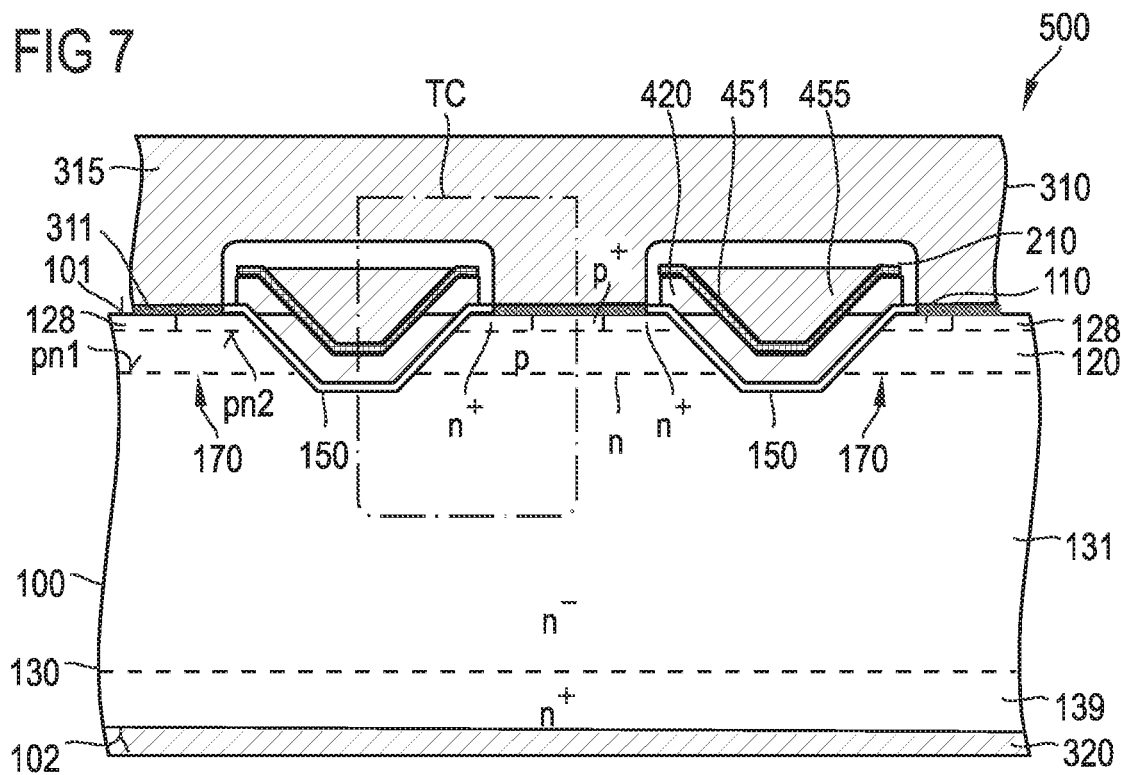
FIG. 7 shows a schematic cross-sectional view of a semiconductor device with a contact layer according to a further embodiment related to transistor cells with shallow trench gate structures.

The semiconductor device 500 of FIG. 7 may be a SiC-TMOSFET with trench gate structures 150 formed in shallow trenches with approximately V-shaped vertical cross-sectional area. The trench gate structures 150 may include a gate electrode 400 that includes a semiconductor layer 420, which may extend along sidewalls and along the bottom of the trench gate structures 150 at approximately uniform thickness. The gate electrode 400 includes a metal structure 450 that may fill the shallow trench.

Semiconductor mesas 170 between neighboring trench gate structures 150 include source regions 110 formed along the first surface 101 and body regions 120 that separate the source regions 110 from a drift structure 130. The body regions 120 may include heavily doped contact zones 149, wherein a mean dopant concentration in the contact zones 149 is significantly higher than in a main zone 121 of the body region 120 outside the contact zone 149. Sidewalls of the semiconductor mesas 170 may be, for example (0-33-8) crystal planes. As regards details of the trench gate structures 150 and the first load electrode 310 reference is made to the description in FIGS. 1 to 6.

FIG. 8 shows an exemplary embodiment of a method of manufacturing a semiconductor device. The method includes providing a silicon carbide substrate (902), wherein a trench extends from a main surface of the silicon carbide substrate into the silicon carbide substrate and wherein a gate dielectric is formed on at least one sidewall of the trench. For example, the gate dielectric is formed on all sidewalls of the trench and on the bottom of the trench. A gate electrode is formed in the trench (904), wherein the gate electrode may include a metal structure and a semiconductor layer between the metal structure and the gate dielectric.

FIGS. 9A-13H shows exemplary embodiments of methods of manufacturing a silicon carbide device. The silicon carbide device may be a semiconductor device as described herein, in particular in connection with the embodiments of FIGS. 1, 2, 3, 4A, 4B, 5, 6, and 7. Vice versa, a semiconductor device described herein may be manufactured with a method as described in connection with the embodiments of FIGS. 9A-13H.

In FIGS. 9A-13H no doped regions are illustrated for simplification. The semiconductor substrate 700 may include doped regions, wherein a doped region may form at least one of a drift structure, a source region, a body region, a shielding region and/or a current spread region as described above. The doped regions may be formed at any stage from before formation of the gate trenches until prior to formation of a main metal layer at the front side.

FIGS. 9A-9H refer to a method of manufacturing a silicon carbide device, wherein a first layer 451 of a gate metal structure 450 and a contact layer 311 of a first load electrode are formed contemporaneously as different sections of the same layer or layer stack.

Gate trenches 750 are formed in a silicon carbide substrate 700. For example, a trench etch mask formed on a main surface 701 of the silicon carbide substrate 700 may mask an anisotropic etch process such as reactive ion etching. The etch process may selectively remove portions of the silicon carbide substrate 700 that are exposed at the main surface 701, thus forming gate trenches 750. The trench etch mask may be removed after the etch process.

Before or after removal of the trench etch mask, a gate dielectric layer 491 may be formed on exposed portions of the silicon carbide substrate 700 and/or in the gate trench 750. Formation of the gate dielectric layer 491 may include a thermal treatment in an atmosphere containing oxygen and/or nitrogen. Alternatively or in addition, formation of the gate dielectric layer 491 may include deposition of a dielectric material, for example, by CVD (chemical vapor deposition).

Figure 9A:
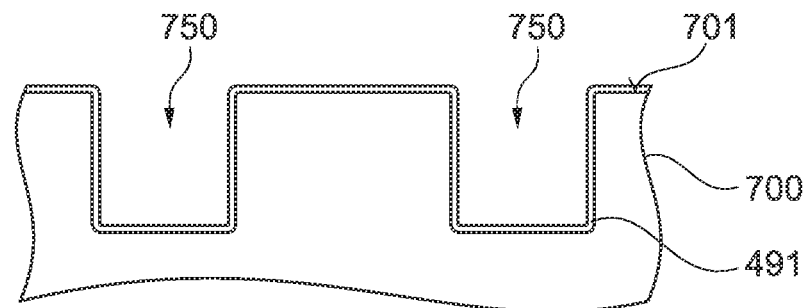
FIGS. 9A to 9H show schematic vertical cross-sectional views of a semiconductor substrate for illustrating a method of manufacturing a semiconductor device according to an embodiment concerning a contemporaneous formation of a contact layer of a first load electrode and a first layer of a metal gate electrode.

FIG. 9A shows the silicon carbide substrate 700 with the gate trenches 750 extending from the main surface 701 into the silicon carbide substrate 700. The silicon carbide substrate 700 may include one or more epitaxy layers formed on a base substrate, wherein the base substrate may be sliced from a crystalline ingot. The one or more epitaxy layers may be uniformly doped. For example, the one or more epitaxy layers may contain nitrogen atoms. The silicon carbide substrate 700 may also include unwanted impurities, for example, oxygen.

The gate trenches 750 may be stripe-shaped with a horizontal longitudinal extension orthogonal to the cross-sectional plane. The gate trenches 750 may run parallel to each other and may be equally spaced.

The gate dielectric layer 491 may include at least one of thermally grown silicon oxide, thermally grown silicon nitride, thermally grown siliconoxinitride, and deposited silicon oxide, e.g., CVD silicon oxide, by way of example. The gate dielectric layer 491 may line the gate trenches 750 at approximately uniform thickness and may cover the main surface 701.

Figure 9B:
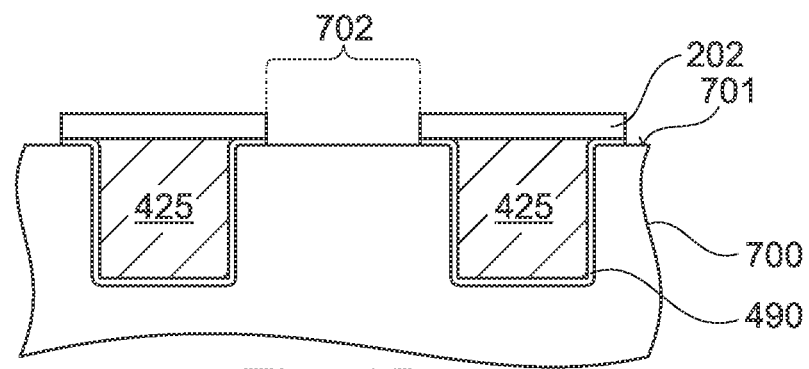

A deposition process, such as, for example, CVD, may be used to deposit n-doped and/or p-doped polycrystalline semiconductor material 425 that fills the gate trenches 750 (see FIG. 9B). Portions of the polycrystalline semiconductor material 425 deposited outside the gate trenches 750 may be removed, for example, by a wet etch process or CMP. A dielectric layer may be deposited and patterned by photolithography to form a first interlayer dielectric portion 202.

FIG. 9B shows a method step, where the polycrystalline semiconductor material 425 fills the gate trenches 750. The first interlayer dielectric portion 202 covers the polycrystalline semiconductor material 425 in the gate trenches 750 and exposes a contact area 702 of the main surface 701. Remaining portions of the gate dielectric layer 491 of FIG. 9A form a gate dielectric 490 lining the gate trenches 750 and separating the polycrystalline semiconductor material 425 from the silicon carbide substrate 700.

A first resist layer may be deposited and patterned by photolithography to form a first resist mask 611 with first resist mask openings 615 in the vertical projection of central portions of the gate trenches 750. A time-controlled anisotropic etch process may remove portions of the first interlayer dielectric portion 202 and of the polycrystalline semiconductor material 425 in the gate trenches 750 in the vertical projection of the first resist mask openings 615.

Figure 9C:
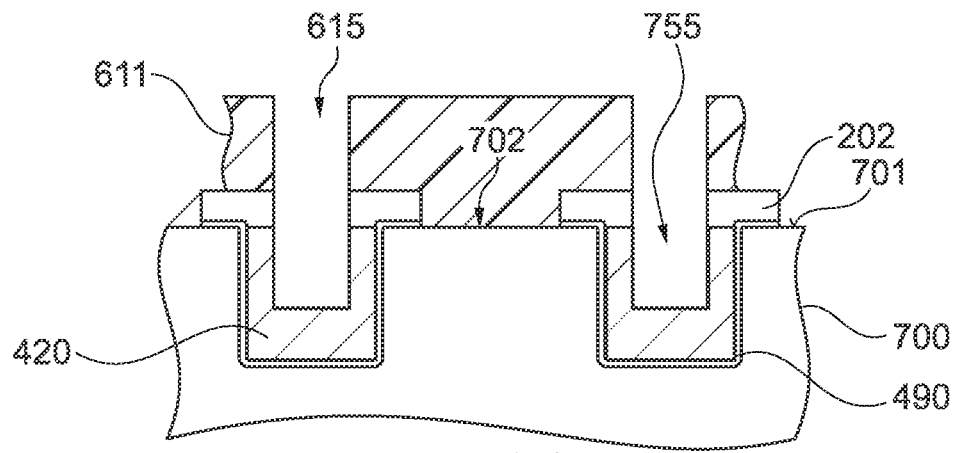

FIG. 9C shows auxiliary trenches 755 extending into the polycrystalline semiconductor material 425 in the gate trenches 750 directly below the first resist mask openings 615. The auxiliary trenches 755 may be a result from the before-described time-controlled anisotropic etch process of the semiconductor material 425 using the first resist mask 611. A remaining portion of the polycrystalline semiconductor material 425 that has not been removed by said etch process, forms a semiconductor layer 420, for example the semiconductor layer 420 as described herein.

According to an embodiment, the formation of the auxiliary trenches 755 may be combined with the process for exposing the contact area 702. For example, one single resist mask may be formed that includes first openings in the vertical projection of the central portions of the gate trenches 750 and second openings in the vertical projection of the contact area 702.

The first resist mask 611 may be removed. A first metal layer 810 may be formed by depositing metal-containing material, e.g., by sputtering and/or vapor deposition. A metal fill layer 815 may be deposited on the first metal layer 810.

Figure 9D:
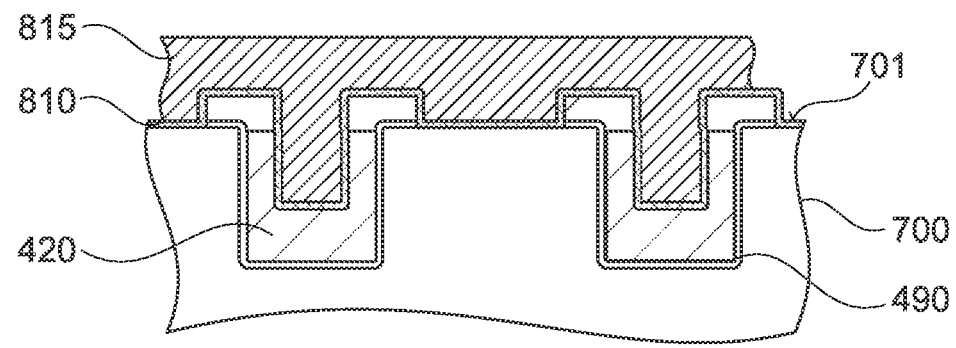

According to FIG. 9D the first metal layer 810 is in direct contact with the silicon carbide substrate 700 in the contact area 702 and in direct contact with the semiconductor layer 420 in the gate trenches 750. However, embodiments may exist where a further layer may be positioned at least in places between the first metal layer 810 and the silicon carbide substrate 700 and/or the semiconductor layer 420. The first metal layer 810 may further cover exposed portions of the first interlayer dielectric portion 202. The first metal layer 810 may include at least one transition metal or transition metal nitride, such as titanium, titanium nitride, tantalum and tantalum nitride. A thickness of the first metal layer 810 may be in a range from 5 nm to 50 nm, by way of example. The metal fill layer 815 may include at least one transition metal like tungsten or copper and/or at least one post-transition metal, e.g., aluminum.

A portion of the metal fill layer 815 deposited above the first interlayer dielectric portion 202 may be removed, e.g., by a recess such as a time-controlled and/or endpoint-controlled wet etching, wherein the recess may stop with or after exposure of the first metal layer 810 on the first interlayer dielectric portion 202.

Figure 9E:
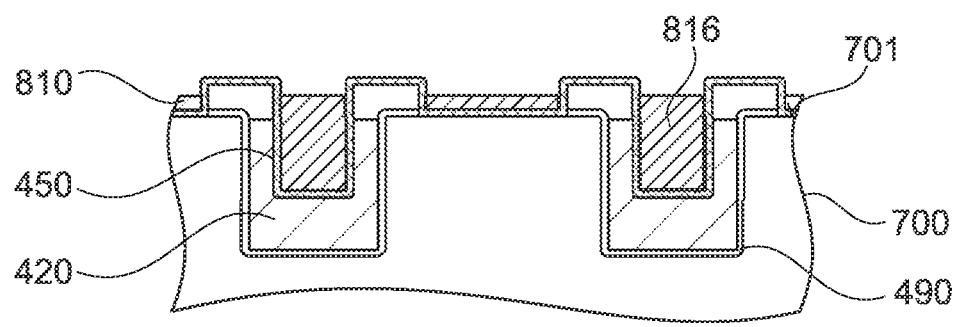

FIG. 9E shows step of the method where a portion of the metal fill layer 815 of FIG. 9D has been removed except for a remaining portion 816 of the metal fill layer 815. In a further method step, exposed portions of the first metal layer 810 may be removed and a second dielectric layer 203 may be deposited, wherein the second dielectric layer 203 may be a conformal layer with approximately uniform thickness.

Figure 9F:
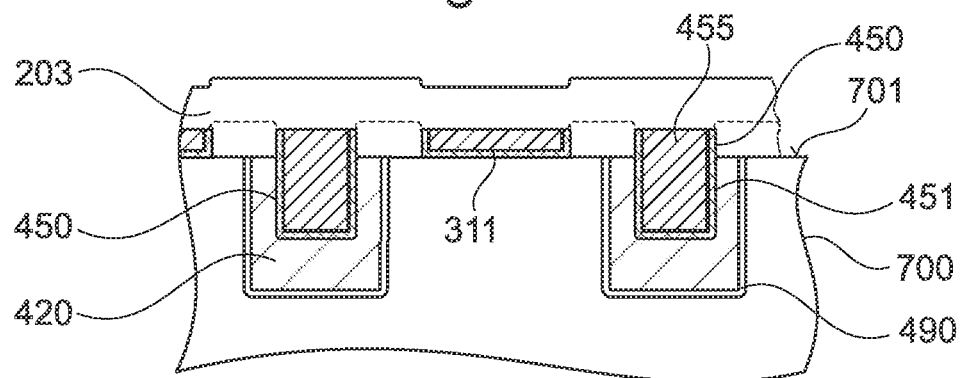

In the method step shown in FIG. 9F, a contact layer 311 is formed in the contact area 702 from a first portion of the first metal layer 810 of FIG. 9E. A second portion of the first metal layer 810 of FIG. 9E forms a metal first layer 451 in the gate trenches 750. The remaining portion 816 of the metal fill layer 815 of FIG. 9E forms metal fill structures 455 in the gate trenches 750. The first layer 451 and the fill structure 455 form a metal structure 450. The second dielectric layer 203 may be patterned by photolithography.

Figure 9G:
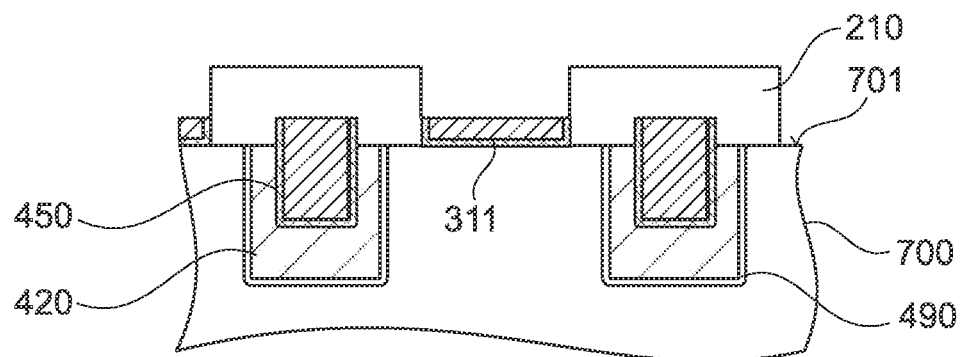

In the method step shown in FIG. 9G, an interlayer dielectric 210 is formed from the first interlayer dielectric portion 202 and from remaining portions of the second dielectric layer 203. The interlayer dielectric 210 may include CVD silicon oxide and/or other dielectric materials, e.g., a doped or undoped glass. A main metal layer may be deposited at the front side and patterned by photolithography (not shown in FIG. 9G).

Figure 9H:
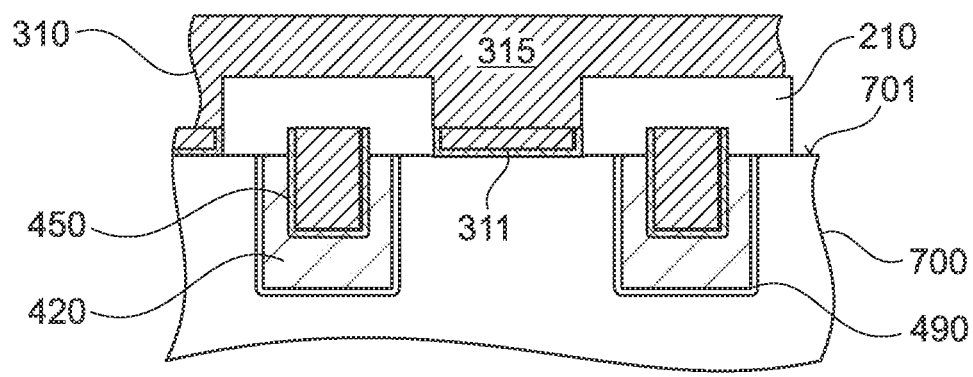

In the method step shown in FIG. 9H, a main metal structure 315 is formed from a remaining portion of the main metal layer. The contact layer 311 and the main metal structure 315 may form at least a portion of a first load electrode 310.

The method of FIGS. 9A to 9H uses the same metal layer for forming the contact layer 311 of the first load electrode 310 and the first layer 451 of the gate metal structure 450. The process avoids degradation of a previously formed contact layer 311 caused by a later formation of the first layer 451 and avoids a degradation of the first layer 451 caused by a later formation of the contact layer 311.

The method according to the embodiment of FIGS. 9A to 9H includes an alignment of the first resist mask openings 615 of FIG. 9C to the gate trenches 750. The following embodiments include deposition of a conformal polycrystalline silicon layer that lines the gate trenches 750 in uniform thickness such that a metal structure 450 of a gate electrode may be formed in a self-aligned manner.

The method described with respect to FIGS. 10A to 10H includes a pre-silicidation in a contact area 702 prior to a contemporaneous formation of a contact layer 311 in the contact area 702 of the main surface 701 and of a metal first layer 451 in the gate trenches 750.

Gate trenches 750 and a gate dielectric layer 491 may be formed as described with reference to FIG. 9A. A conformal n-doped or p-doped polycrystalline semiconductor layer may be deposited and patterned by photolithography to form a semiconductor layer 420 in the gate trenches 750.

Figure 10A:
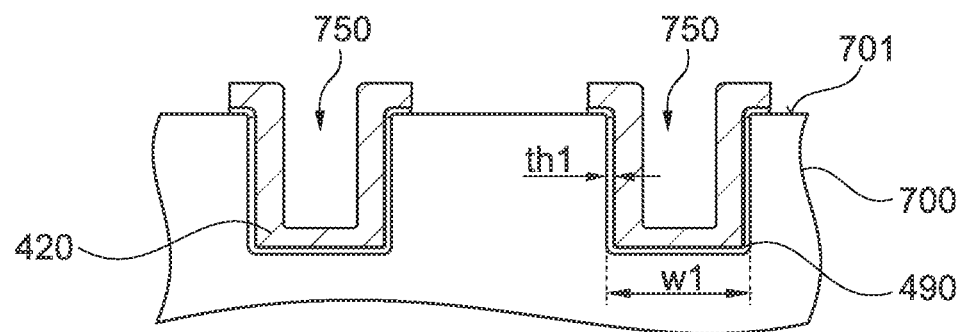
FIGS. 10A to 10H show schematic vertical cross-sectional views of a semiconductor substrate for illustrating a method of manufacturing a semiconductor device according to another embodiment concerning a pre-silicidation for a contact layer of a first load electrode.

FIG. 10A shows the semiconductor layer 420 lining each gate trench 750 at substantially uniform thickness, wherein a thickness th1 of the semiconductor layer 420 is smaller than half of a lateral width w1 of the gate trenches 750. A gate dielectric 490 separates the semiconductor layer 420 from the silicon carbide substrate 700. A contact area 702 of the main surface 701 is exposed.

Along an exposed surface of the semiconductor layer 420 (e.g., a surface that is opposite the gate dielectric 490), the semiconductor layer 420 may be oxidized to form a sacrificial oxide layer 471 on the semiconductor layer 420. A first sacrificial material 472 may be deposited that fills the gate trenches 750. Portions of the first sacrificial material 472 outside the gate trenches 750 may be removed, for example, by wet etching. A second sacrificial material 475 may be deposited and patterned by photolithography to expose the contact area 702.

Figure 10B:
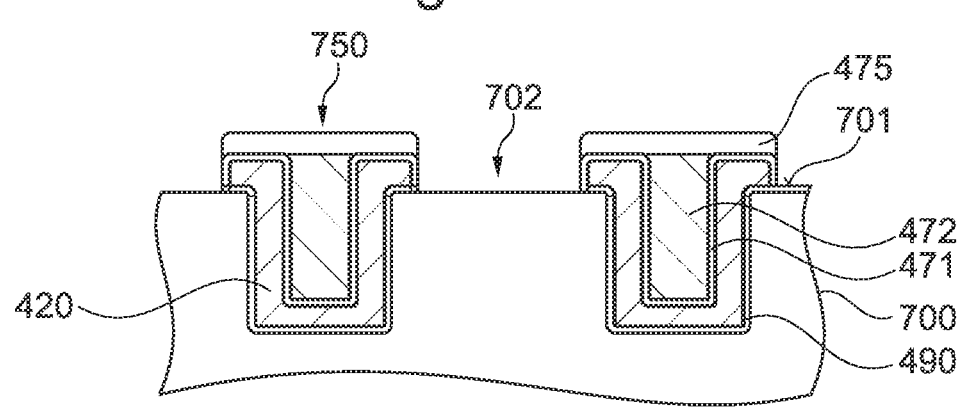

FIG. 10B shows the first sacrificial material 472 filling the gate trenches 750. The first sacrificial material 472 may be polycrystalline silicon, by way of example. The sacrificial oxide layer 471 separates the first sacrificial material 472 from the semiconductor layer 420. The second sacrificial material 475 covers the first sacrificial material 472 and exposes the contact area 702. The second sacrificial material 475 may be a dielectric material, for example a silicon nitride.

Pre-silicidation of the exposed contact area 702 may include, for example, a heating treatment at a temperature of at least 700° C. The remaining portions of the second sacrificial material 475 may be removed to expose the first sacrificial material 472 in the gate trenches 750.

Figure 10C:
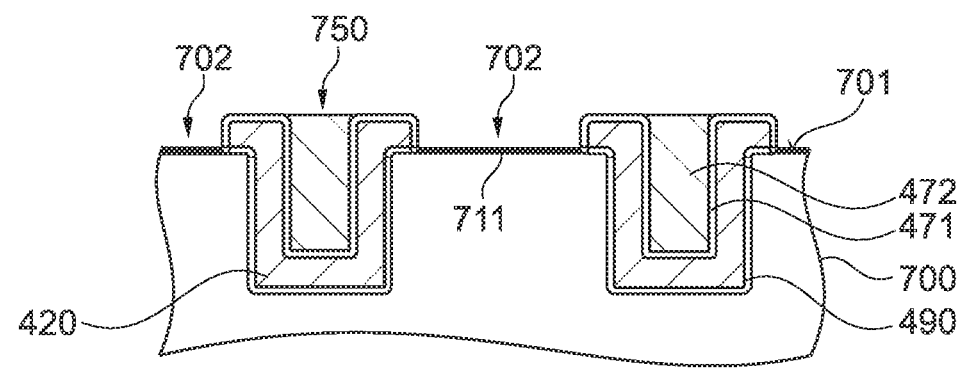

FIG. 10C shows a pre-silicided portion 711 of the silicon carbide substrate 700 in the contact area 702. The first sacrificial material 472 may be removed, for example, by wet etching selective to the material of the sacrificial oxide layer 471. The sacrificial oxide layer 471 may be removed, for example, by a wet etch process that is selective with respect to the material of semiconductor layer 420.

In a further method step, a first metal layer and a metal fill layer may be deposited and recessed (not shown in FIGS. 10A-10H). For this, the first metal layer and/or the metal fill layer may be at least partly removed. This may include a wet etching process and/or a CMP that stops with exposure of the semiconductor layer 420 or with exposure of portions of the first metal layer on horizontal portions of the semiconductor layer 420. By this, a metal structure 450 may be formed.

Figure 10D:
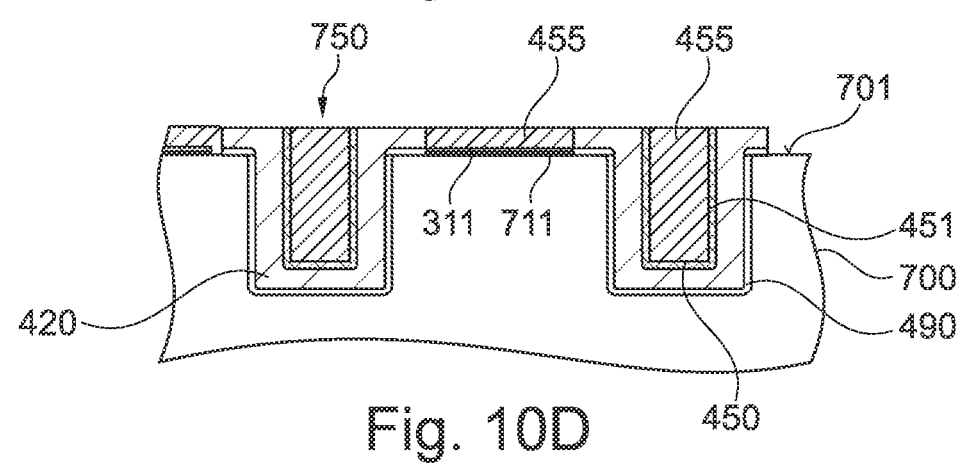

The gate trenches 750 in FIG. 10D include a metal structure 450 with a first layer 451 and a fill structure 455. The first layer 451 is formed from a first portion of the first metal layer. The fill structure 455 is formed from a remaining portion of the metal fill layer. In the contact area 702 a contact layer 311 is formed on a pre-silicided portion 711 of the main surface 701.

An exposed portion of the semiconductor layer 420 between the contact area 702 and the metal structures 450 may be partly removed, for example, by a time-controlled wet etch process.

Figure 10E:
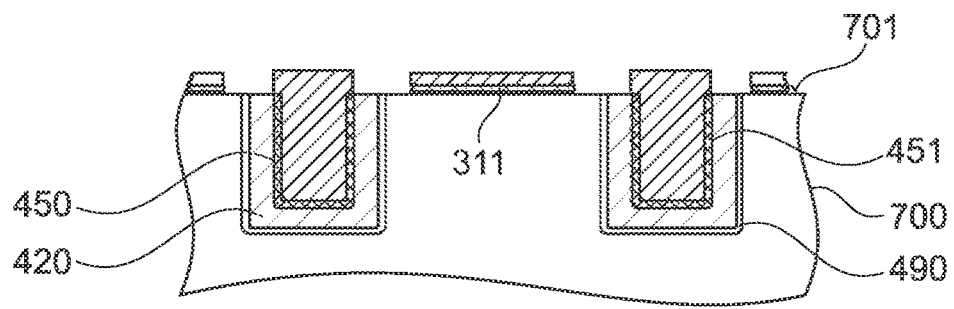

As shown in the exemplary embodiment of FIG. 10E the step of removing part a portion of the semiconductor layer 420 may stop when an upper edge of the semiconductor layer 420 is substantially flush with the main surface 701. Afterwards, an interlayer dielectric layer 205 may be deposited in the recess produced by the removal process.

Figure 10F:
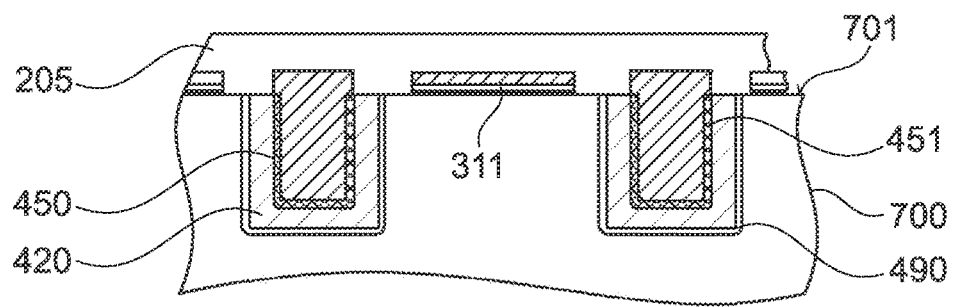

FIG. 10F shows the interlayer dielectric layer 205 filling spaces between the contact area 702 and the metal structures 450. The interlayer dielectric layer 205 may be patterned by photolithography to expose the contact layer 311.

Figure 10G:
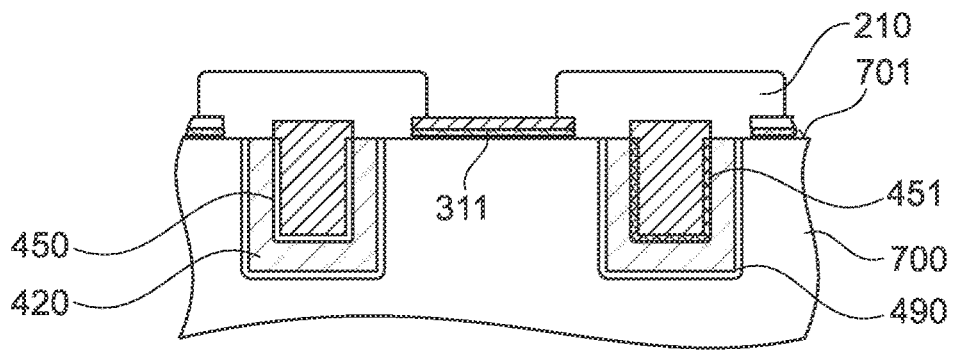

FIG. 10G shows residues of the interlayer dielectric layer 205 forming an interlayer dielectric 210 covering the metal structures 450. A main metal layer may be deposited at the front side and patterned by photolithography (not shown in FIG. 10G).

Figure 10H:
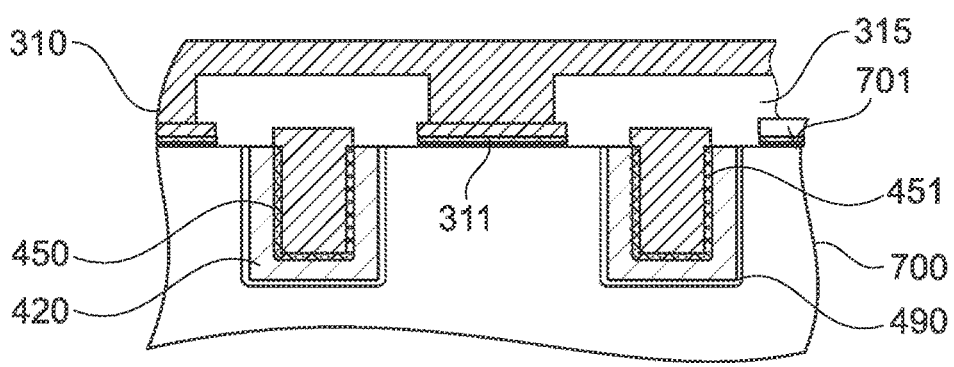

FIG. 10H shows a first load electrode 310 that includes the contact layer 311 and a main metal structure 315 formed from a portion of the main metal layer. As regards details and materials of the metal structure 450, the semiconductor layer 420, the gate dielectric 490, the contact layer 311, the main metal structure 315, and the interlayer dielectric 210 reference is made to the description of FIGS. 9A-9H.

FIGS. 11A-11F refer to a method that may be combined with a hot implant. The hot implant includes ion implantation at elevated temperature and makes use of the effect that the density of crystal defects induced by the implant decreases with increasing temperature. The high temperature implantation allows an increased dose of implant before reaching an amorphization of the SiC.

Figure 11A:
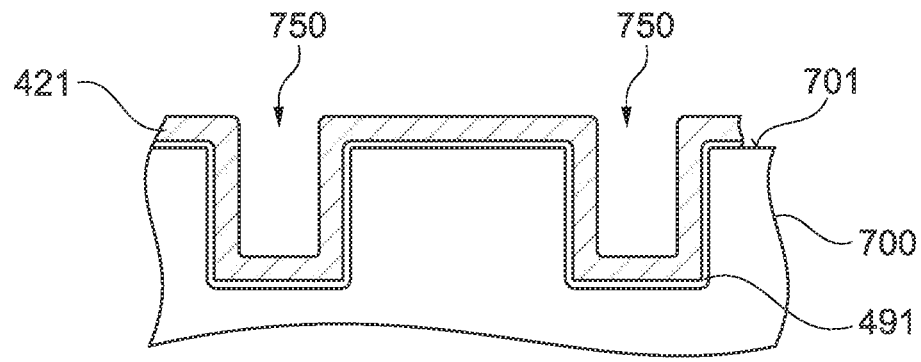
FIGS. 11A to 11F show schematic vertical cross-sectional views of a semiconductor substrate for illustrating a method of manufacturing a semiconductor device according to a further embodiment concerning formation of a first layer of a metal gate electrode prior to formation of a contact layer of a first load electrode.

FIG. 11A shows a conformal polycrystalline layer 421 formed on a gate dielectric layer 491 as described with reference to FIG. 9A. A first auxiliary metal layer 820 may be formed on the polycrystalline layer 421, e.g., by sputtering.

Figure 11B:
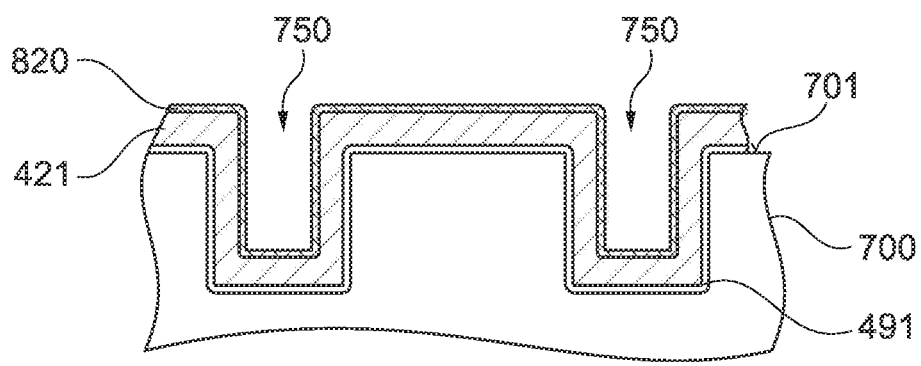

FIG. 11B shows the first auxiliary metal layer 820 that may include a transition metal or transition metal nitride, for example titanium, titanium nitride, tantalum or tantalum nitride. The first auxiliary metal layer 820 may cover the polycrystalline layer 421 at approximately uniform thickness.

Figure 11C:
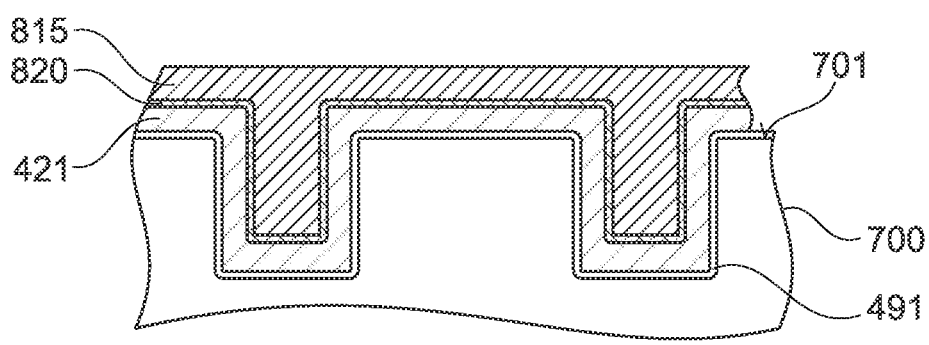

FIG. 11C shows a metal fill layer 815 that may be deposited, e.g., by CVD and that fills the gate trenches 750, in particular portions of the gate trench 750 that are not been filled by the polycrystalline layer 421 and the first auxiliary metal layer 820. The metal fill layer 815 may include, e.g., tungsten or may consist of tungsten. Portions of the metal fill layer 815, of the first auxiliary metal layer 820 and of the polycrystalline layer 421 outside the gate trenches 750 may be removed. The removal may include one or more wet etch processes and/or a CMP that may stop on the gate dielectric layer 491.

Figure 11D:
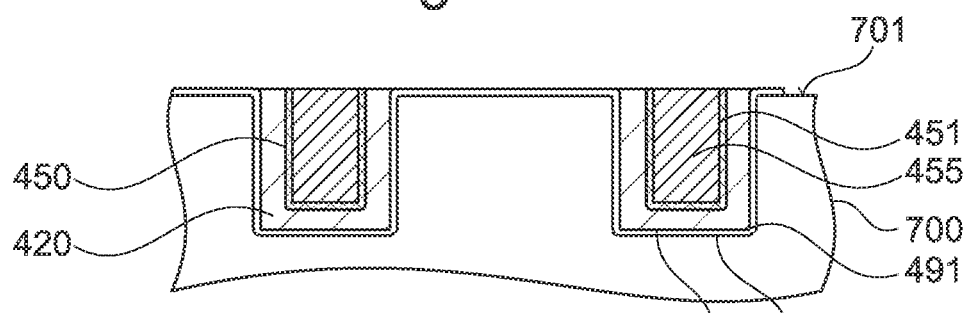

FIG. 11D shows trench gate structures 150 with a gate electrode 400, wherein the gate electrode 400 includes a metal structure 450 formed from a portion of the metal fill layer 815 of FIG. 11C, a first layer 451 formed from a portion of the first auxiliary metal layer of FIG. 11C and a semiconductor layer 420 formed from a portion of the polycrystalline layer 421 of FIG. 11C.

Figure 11E:
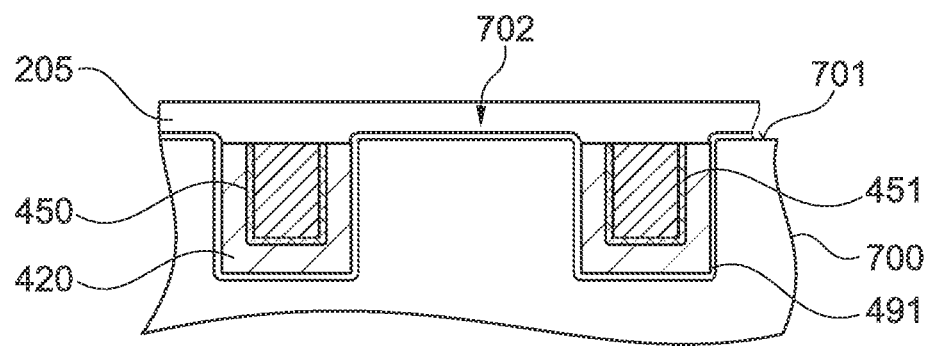
Figure 11F:
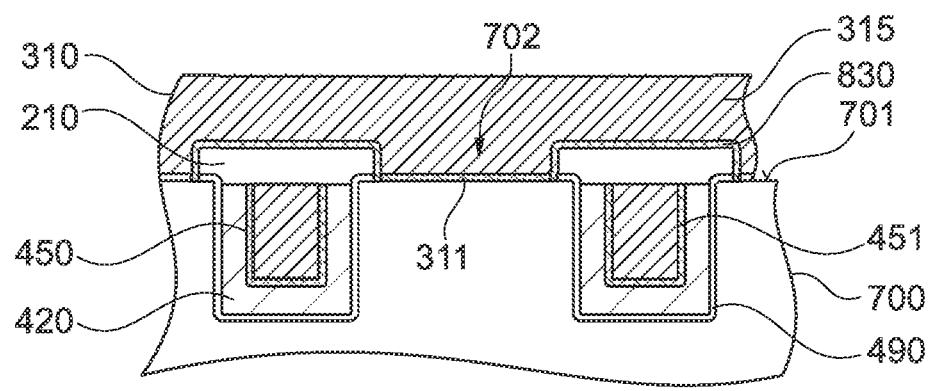

FIG. 11E shows an interlayer dielectric layer 205 formed on the main surface 701, e.g., by CVD. The interlayer dielectric layer 205 may be patterned to expose a contact area 702 (cp. FIG. 11F). A contact metal layer 830 may be formed or deposited on the exposed contact area 702 or on both the exposed contact area 702 and the interlayer dielectric 210. A main metal layer may be formed on the contact metal layer 830.

Alternatively, the contact metal layer 830 may be deposited prior to removal of a resist mask that patterns the interlayer dielectric layer 205.

FIG. 11F shows an interlayer dielectric 210 formed from remaining portions of the interlayer dielectric layer 205 of FIG. 11E. A portion of the contact metal layer 830 in the contact area 702 of the main surface 701 forms a contact layer 311 of a first load electrode 310. The contact metal layer 830 may include a transition metal or transition metal nitride, for example titanium, titanium nitride, tantalum or tantalum nitride. A remaining portion of the main metal layer forms a main metal structure 315 of the first load electrode 310. The main metal structure 315 may include an aluminum copper alloy.

The formation of the contact layer 311 according to FIGS. 11A to 11F does not involve any high temperature step that may result in a silicidation process effective for the first layer 451. Volume expansion of the metal structure 450 and cracks in the interlayer dielectric 210 that may result from a possible volume expansion of the metal structure 450 can be avoided.

The following methods use nickel aluminum for forming a contact layer between a load electrode and the silicon carbide substrate. Nickel aluminum provides low-ohmic and reliable contacts to n-type and p-type regions in a silicon carbide body. Formation of nickel aluminum contacts typically involves high temperature processes.

FIGS. 12A to 12G refer to an embodiment of the method, where nickel aluminum contacts are formed prior to a metal gate such that possible high temperature processes used for forming the nickel aluminum contacts have no impact on the metal gate.

Figure 12A:
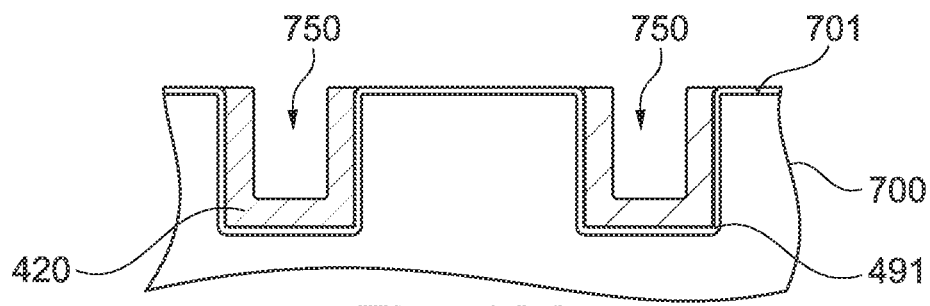
FIGS. 12A to 12G show schematic vertical cross-sectional views of a semiconductor substrate for illustrating a method of manufacturing a semiconductor device according to an embodiment concerning formation of a nickel aluminum contact layer of a first load electrode prior to formation of a first layer of a metal gate electrode.

FIG. 12A shows gate trenches 750 extending from a main surface 701 into a silicon carbide substrate 700, a gate dielectric layer 491 on the main surface 701 and lining the gate trenches 750 and a semiconductor layer 420 formed from portions a conformal polycrystalline silicon layer, wherein other portions of the polycrystalline silicon layer deposited outside the gate trenches 750 may be removed, for example by CMP. A photoresist layer may be deposited and patterned by photolithography to form a second resist mask 620.

Figure 12B:
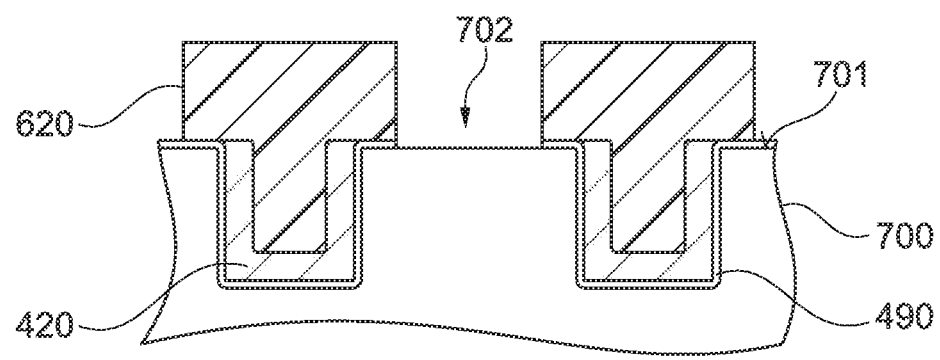

FIG. 12B shows that the second resist mask 620 covers the gate trenches 750 and exposes a contact area 702 of the main surface 701. An exposed portion of the gate dielectric layer 491 may be removed. A nickel aluminum layer 840 may be formed. Forming the nickel aluminum layer 840 may include a deposition process, e.g., sputtering.

Figure 12C:
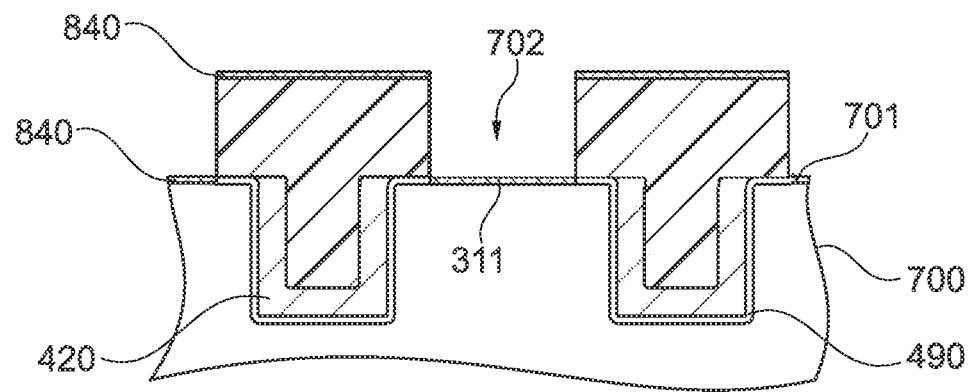

According to FIG. 12C, a first portion of the nickel aluminum layer 840 is formed in the contact area 702 and a second portion of the nickel aluminum layer 840 is formed on the second resist mask 620. Removal of the second resist mask 620 lifts off the second portion of the nickel aluminum layer 840. A heating treatment, for example, a rapid thermal anneal with a minimum temperature of at least 1100° C. may convert the first portion of the nickel aluminum layer 840 into a contact layer 311 in the contact area 702, wherein the contact layer 311 includes nickel, aluminum and a nickel silicide. A second auxiliary metal layer 850 and a metal fill layer 815 may be deposited over the contact layer 311 and the semiconductor layer 420.

Figure 12D:
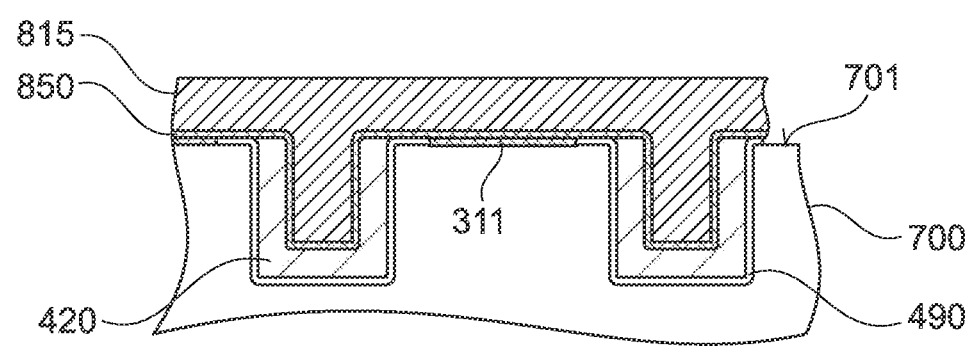

FIG. 12D shows the second auxiliary metal layer 850 lining the gate trenches 750 and the metal fill layer 815 filling the gate trenches 750. A portion of the metal fill layer 815 above the main surface 701 may be removed. The removal of the portion of the metal fill layer 815 above the main surface 701 may include CMP and may include the removal of a portion of the second auxiliary metal layer 850 outside the gate trenches 750. The CMP may stop at the contact layer 311 or at the second auxiliary metal layer 850. A selective etch process may remove an exposed portion of the second auxiliary metal layer 850.

Figure 12E:
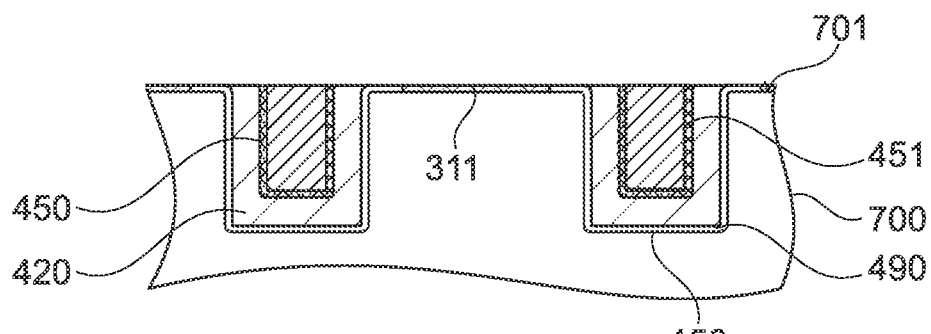

FIG. 12E shows trench gate structures 150 including a metal structure 450, wherein the metal structure 450 includes a first layer 451 formed from a portion of the second auxiliary metal layer 850 of FIG. 12D and a metal structure 450 formed from a remaining portion of the metal fill layer 815 of FIG. 12D.

Figure 12F:
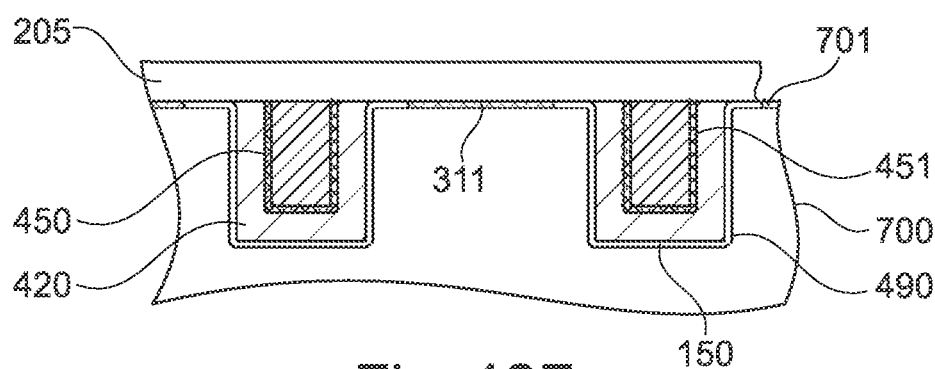

FIG. 12F shows an interlayer dielectric layer 205 deposited above the main surface 701. The interlayer dielectric layer 205 may be patterned to expose the contact layer 311. A main metal layer may be deposited as described with reference to FIG. 9H or 11F.

Figure 12G:
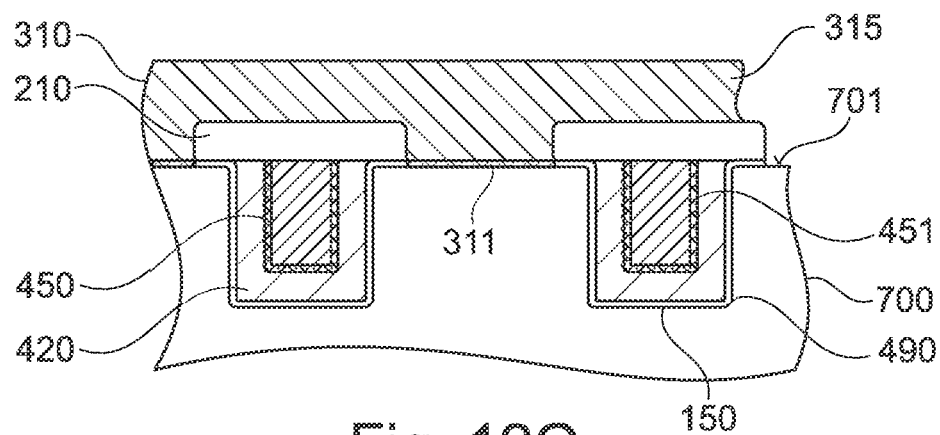

FIG. 12G differs from FIG. 11F at least in that the contact layer 311 is based on nickel and aluminum.

The method of FIGS. 13A to 13H differs from the method of FIG. 11A to 11F mainly in that a molybdenum layer is formed instead of a first metal auxiliary layer that comprises another transition metal or transition metal nitride.

The method steps shown in FIGS. 13A to 13E correspond to those of FIGS. 11A to 11E, wherein instead of the first auxiliary metal layer 820 of FIGS. 11A to 11E a molybdenum containing layer 880 is formed on the polycrystalline layer 421.

Figure 13A:
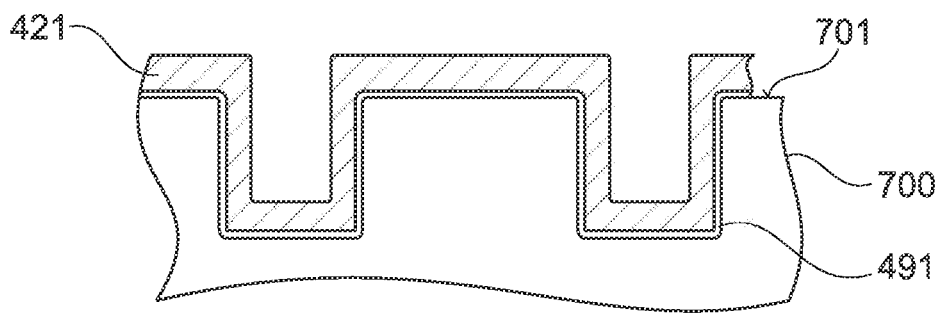
FIGS. 13A to 13H show schematic vertical cross-sectional views of a semiconductor substrate for illustrating a method of manufacturing a semiconductor device according to an embodiment concerning formation of a first layer of a metal gate electrode containing molybdenum prior to formation of a nickel aluminum contact layer of a first load electrode.
Figure 13B:
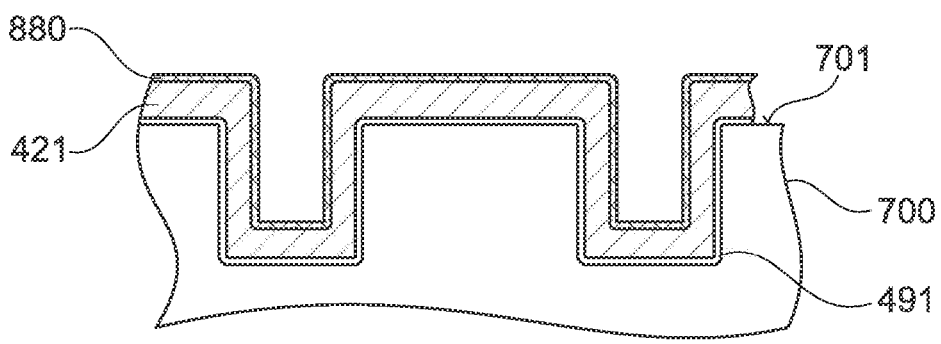
Figure 13C:
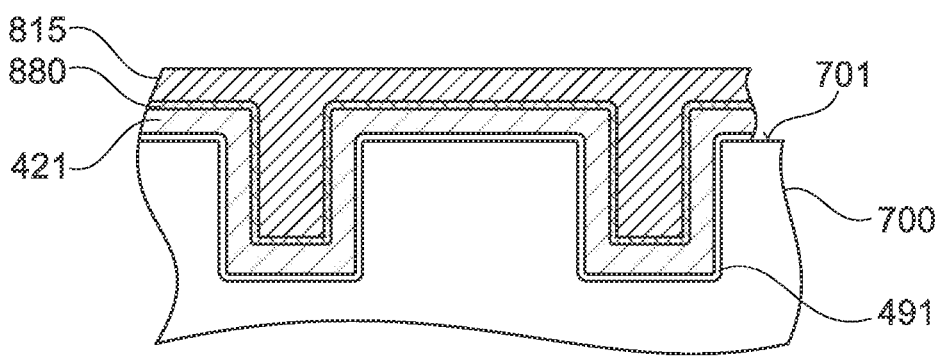
Figure 13D:
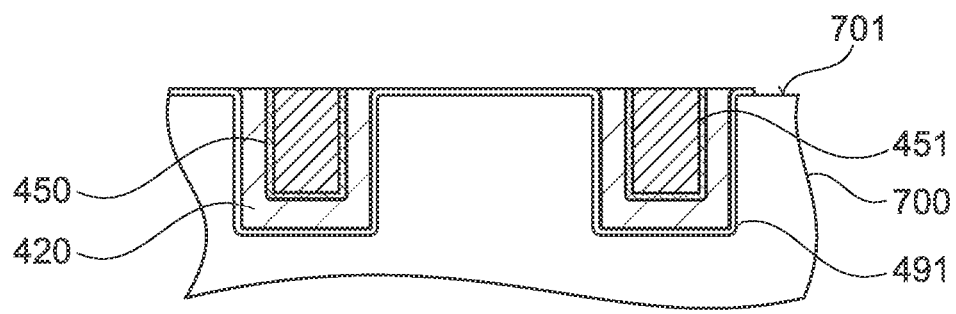
Figure 13E:
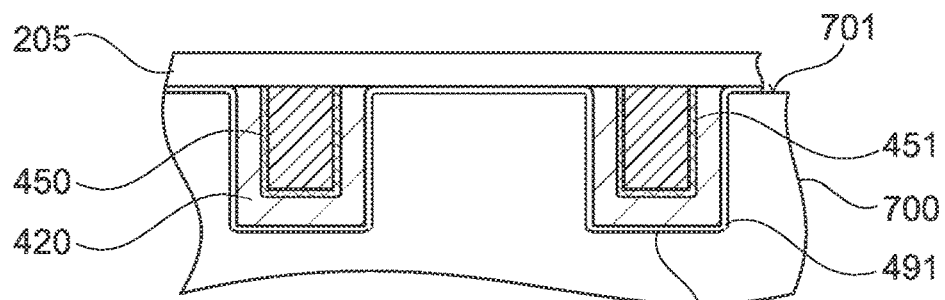

Accordingly, in FIG. 13E the trench gate structure 150 includes a semiconductor layer 420 and a metal structure 450, wherein the metal structure 450 includes a metal first layer 451 including molybdenum, wherein molybdenum may be the only main constituent. As regards further details, reference is made to the description of FIG. 11A to FIG. 11E.

A photoresist layer may be deposited on the interlayer dielectric layer of FIG. 13E and patterned by photolithography to form a third resist mask 630 that exposes the contact area 702. Using the third resist mask 630 as an etch mask, a portion of the interlayer dielectric layer 205 above the contact area 702 may be removed.

Figure 13F:
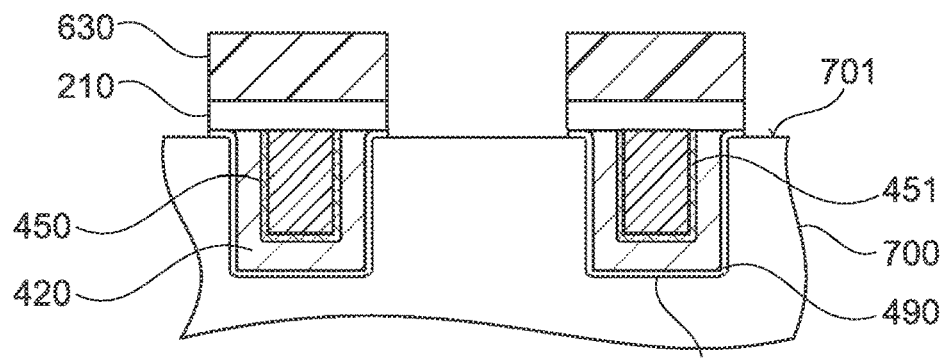

FIG. 13F shows the third resist mask 630 and the interlayer dielectric 210 formed by a remaining portion of the interlayer dielectric layer 205 of FIG. 13E. A nickel aluminum layer 840 may be deposited, for example, by sputtering.

Figure 13G:
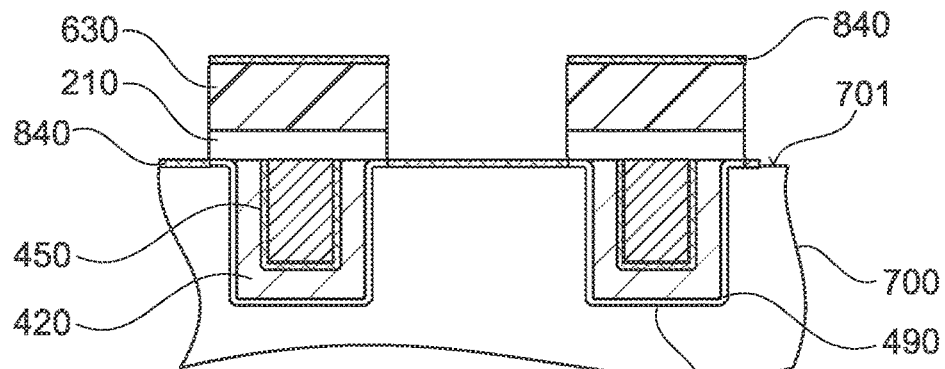

FIG. 13G shows a first portion of the deposited nickel aluminum layer 840 covering the contact area 702 and a second portion of the deposited nickel aluminum layer 840 covering a horizontal surface section of the third resist mask 630.

The third resist mask 630 is removed and lifts off the second portion of the nickel aluminum layer 840. A heating treatment may silicide the remaining first portion of the nickel aluminum layer 840 in the contact area 702 of the silicon carbide substrate 700. Non-reacted constituents of the nickel aluminum layer 840 may be removed and a second thermal treatment may be performed, for example a second RTP with a minimum temperature of at least 750° C. and at most 1100° C. A main metal layer may be deposited and patterned as described above.

Figure 13H:
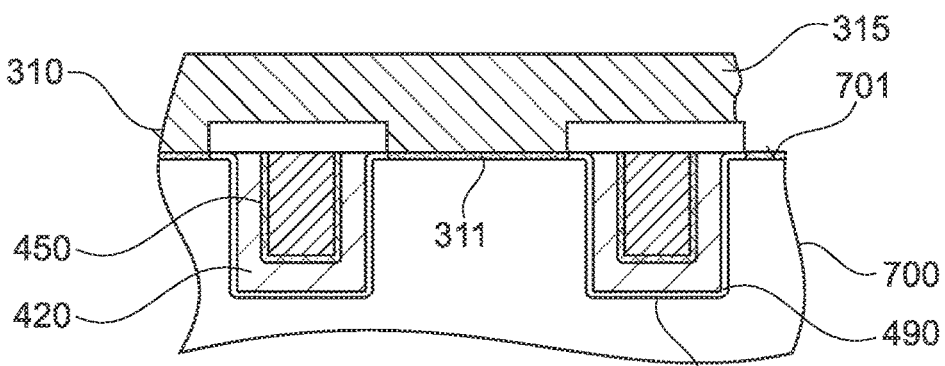

FIG. 13H shows a first load electrode 310 that includes a main metal structure 315 formed from the main metal layer. The first load electrode 310 includes a contact layer 311 formed from a nickel aluminum layer that may include a silicided portion.

The temperatures applied for the formation of the contact layer 311 are below the formation temperature of molybdenum silicide. Therefore formation of the contact layer 311 does not involve a silicidation in the trench gate structure 150 that may damage the interlayer dielectric 210.

FIG. 14 shows another semiconductor device 500 with a transistor cell TC and with a first load electrode 310 electrically connected to a source region 110 and to a body region 120 of the transistor cell TC through a contact layer 311. The contact layer 311 may be absent in another embodiment. The semiconductor device 500 further includes a trench gate structure 150 that extends from a first surface 101 into a silicon carbide body 100 as described in more detail with reference to FIGS. 1 and 2.

The trench gate structure 150 includes a gate electrode 400 and a gate dielectric 490. In addition to the gate electrode 400 and the gate dielectric 490, the trench gate structure 150 may include further insulating and further conductive structures, wherein the further conductive structures may be electrically separated from the gate electrode 400.

The gate electrode 400 may include a semiconductor layer 420, which is in contact with the gate dielectric 490. The semiconductor layer 420 may be a conformal layer with a thickness in a range from 50 nm to 500 nm, for example from 100 nm to 300 nm or may completely fill the space between two portions of the gate dielectric 490 which are formed on opposite sidewalls of the trench gate structure 150. The trench gate structure 150 and the gate electrode 400 may be devoid of metallic structures.

The semiconductor layer 420 may include phosphorus atoms as unwanted impurities or as intended impurities, wherein a concentration of the phosphorus atoms in the semiconductor layer 420 is at most $1 \times 10^{19}$ cm$^{-3}$ or at most $5 \times 10^{18}$ cm$^{-3}$ or at most $10^{18}$ cm$^{-3}$. A lower phosphorus content in the semiconductor layer 420 may mitigate negative effects induced by the presence of phosphorus.

For example, the semiconductor layer 420 may be a comparatively heavily doped n-type polycrystalline silicon layer with a mean dopant concentration of at least $10^{20}$ cm$^{-3}$, wherein the semiconductor layer 420 contains arsenic atoms, sulfur atoms and/or selenium atoms. The semiconductor layer 420 may contain no phosphorus atoms or only a small portion of phosphorus atoms at a phosphor concentration of at most $5 \times 10^{18}$ cm$^{-3}$ or at most $10^{18}$ cm$^{-3}$.

According to an embodiment, the semiconductor layer 420 may be a comparatively heavily doped p-type polycrystalline silicon layer with a mean dopant concentration of at least $10^{20}$ cm$^{-3}$, wherein the semiconductor layer 420 may exclusively contain acceptor atoms, e.g. boron atoms. Alternatively, the semiconductor layer 420 may further contain donator atoms, e.g., phosphorus atoms, wherein a concentration of the phosphorus atoms is at most $5 \times 10^{18}$ cm$^{-3}$ or at most $10^{18}$ cm$^{-3}$.

The gate electrode 400 with p-doped semiconductor layer 420 may be combined with an n-channel transistor cell TC with n-doped source region 110 and p-doped body region 120. Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device, comprising:
    a gate electrode extending from a first surface of a silicon carbide body into the silicon carbide body; and
    a gate dielectric between the gate electrode and the silicon carbide body, the gate electrode comprising a metal structure and a semiconductor layer between the metal structure and the gate dielectric,
    wherein the silicon carbide body comprises a drift structure, a source region and a body region, wherein the body region forms a first pn junction with the drift structure and a second pn junction with the source region, wherein the source region is positioned between the body region and the first surface, and wherein the body region is in contact with the gate dielectric;
    wherein the metal structure comprises an upper surface that is coplanar with or above the first surface of the silicon carbide body,
    wherein the upper surface of the metal structure is covered by an interlayer dielectric, and
    wherein the metal structure vertically extends from the upper surface to a bottom of the metal structure that is disposed below the second pn junction.

2. The semiconductor device of claim 1, wherein the semiconductor layer comprises doped polycrystalline silicon and/or intrinsic polycrystalline silicon.

3. The semiconductor device of claim 1, wherein the semiconductor layer comprises p-doped polycrystalline silicon.

4. The semiconductor device of claim 1, wherein the metal structure comprises a first layer, and wherein the first layer is in contact with the semiconductor layer and comprises a first transition metal.

5. The semiconductor device of claim 4, wherein the first layer further comprises nitrogen.

6. The semiconductor device of claim 4, wherein the first transition metal is molybdenum, titanium or tantalum.

7. The semiconductor device of claim 4, wherein the metal structure comprises a fill structure, wherein the first layer is positioned between the fill structure and the semiconductor layer, wherein the fill structure comprises a second transition metal, and wherein the fill structure differs from the first layer in at least one main constituent.

8. The semiconductor device of claim 7, wherein the second transition metal is different from the first transition metal.

9. The semiconductor device of claim 4, further comprising:
    a contact layer in contact with the silicon carbide body,
    wherein the contact layer comprises nickel aluminum,
    wherein the first layer of the metal structure comprises molybdenum and/or molybdenum nitride.

10. The semiconductor device of claim 4, wherein a second layer is positioned between the first layer and the fill structure, wherein the second layer comprises a third transition metal, and wherein the second layer differs from the first layer in at least one main constituent.

11. The semiconductor device of claim 4, further comprising:
    a contact layer in contact with the silicon carbide body,
    wherein the contact layer comprises titanium, titanium nitride, tantalum or tantalum nitride,
    wherein the first layer of the metal structure comprises titanium, titanium nitride, tantalum and/or tantalum nitride.

12. The semiconductor device of claim 1, further comprising:
    a gate structure on the first surface of the silicon carbide body,
    wherein the gate structure and the gate electrode are electrically connected at at most two contact areas,
    wherein the contact areas are spaced from each other along a first direction.

13. The semiconductor device of claim 12, further comprising:
    a first load electrode on the first surface of the silicon carbide body,
    wherein the gate structure is positioned between the first load electrode and a lateral surface of the silicon carbide body.

14. The semiconductor device of claim 12, wherein the gate structure comprises a gate pad and at least one gate conducting line, and wherein the gate conducting line is connected with the gate pad.

15. The semiconductor device of claim 1, wherein the silicon carbide body comprises a plurality of gate electrodes, wherein each of the gate electrodes has a longitudinal extension along a first direction, and wherein the gate electrodes are spaced from each other orthogonally to the first direction.

16. The semiconductor device of claim 1, wherein the upper surface of the metal structure is coplanar with the first surface of the silicon carbide body.

* * * * *